United States Patent
Yoshinaga

(10) Patent No.: US 7,924,205 B2
(45) Date of Patent: Apr. 12, 2011

(54) SUCCESSIVE APPROXIMATION TYPE ANALOG/DIGITAL CONVERTER AND OPERATION METHOD OF SUCCESSIVE APPROXIMATION TYPE ANALOG/DIGITAL CONVERTER

(75) Inventor: Chikashi Yoshinaga, Yokohama (JP)

(73) Assignee: Renesas Electronics Corporation, Kanagawa (JP)

( * ) Notice: Subject to any disclaimer, the term of this patent is extended or adjusted under 35 U.S.C. 154(b) by 46 days.

(21) Appl. No.: 12/482,601

(22) Filed: Jun. 11, 2009

(65) Prior Publication Data
US 2009/0309778 A1 Dec. 17, 2009

(30) Foreign Application Priority Data

Jun. 11, 2008 (JP) .................... 2008-152738

(51) Int. Cl.
*H03M 1/38* (2006.01)
(52) U.S. Cl. ........................ 341/161; 341/118
(58) Field of Classification Search .................. 341/161, 341/118, 120, 155, 165, 150, 156, 159, 122, 341/154, 163, 172
See application file for complete search history.

(56) References Cited

U.S. PATENT DOCUMENTS 5,675,340 A * 10/1997 Hester et al. .................. 341/156

OTHER PUBLICATIONS

Akira Hayakawa et al—High Performance Successive Approximation ADC Architecture—ECT-06-31—Electronic Engineering Department, Faculty of Engineering, Gunma University, 1-5-1 Tenjin-cho Kiryu Gunma Japan 376-8515—Department of Electronics & Communication Eng., Musashi Institute of Technology, 1-28-1 Tamatsutsumi, Setagaya Tokyo 158-8557 Japan—pp. 1-6.

* cited by examiner

*Primary Examiner* — Joseph Lauture
(74) *Attorney, Agent, or Firm* — Young & Thompson

(57) ABSTRACT

In a successive approximation-type A/D converter, an S/H circuit samples and holds an analog input voltage. A D/A converter section receives current digital data corresponding to a current search voltage range, and outputs a plurality of comparison voltages based on the current digital data. A comparator section performs parallel comparison in which the held analog input voltage is compared with each of the plurality of comparison voltages. A successive approximation register section outputs digital data for a next search voltage range within the current search voltage range as the current digital data to the digital-to-analog converter section based on a result of the parallel comparison using the current search voltage range. A timing control circuit generates a switching signal from the parallel comparison to a redundant comparison such that the redundant comparison is performed.

18 Claims, 17 Drawing Sheets

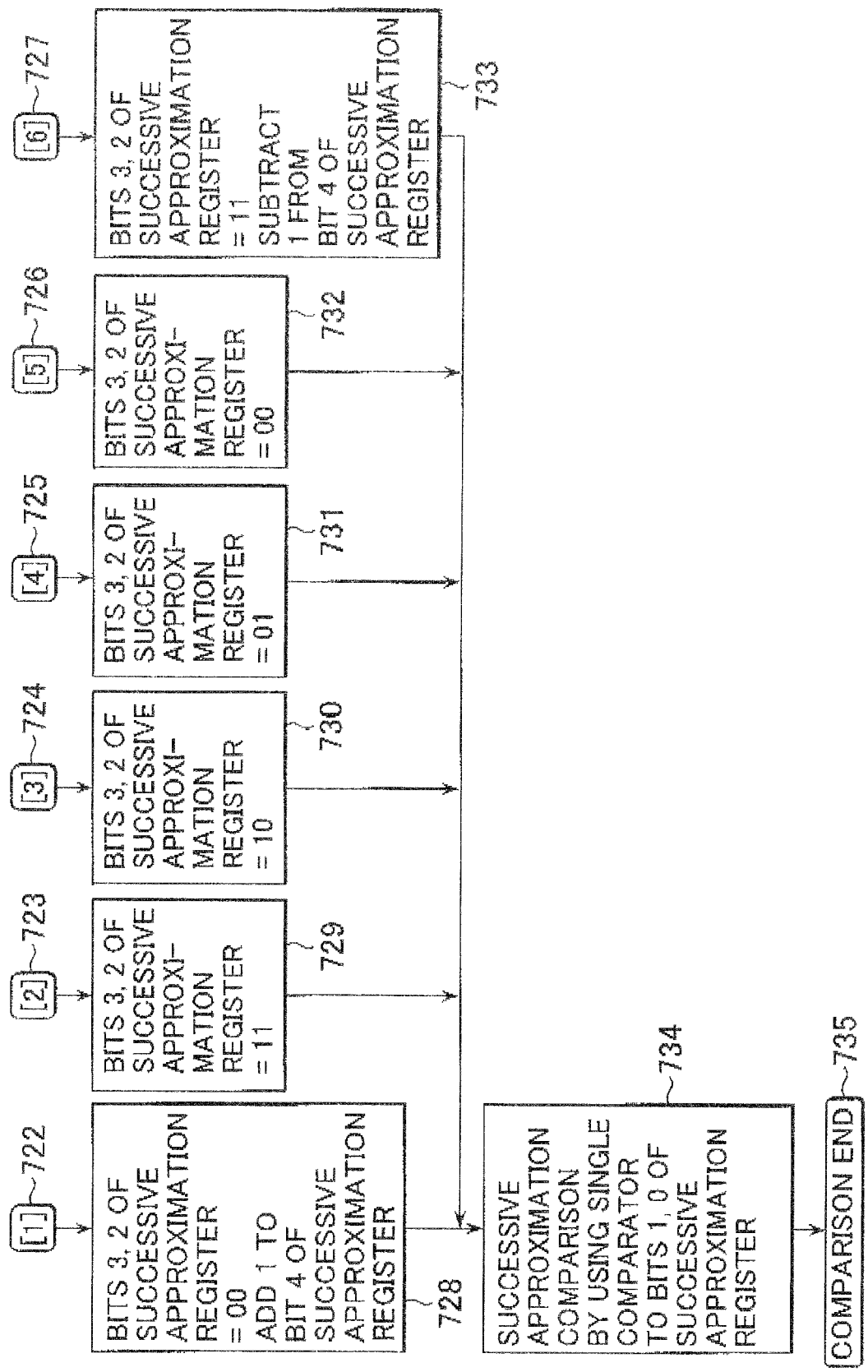

SUCCESSIVE APPROXIMATION TYPE ANALOG/DIGITAL CONVERTER AND OPERATION METHOD OF SUCCESSIVE APPROXIMATION TYPE ANALOG/DIGITAL CONVERTER

INCORPORATION BY REFERENCE

This application claims priority on convention based on Japanese Patent Application No. 2008-152738. The disclosure thereof is incorporated herein by reference.

BACKGROUND OF THE INVENTION

1. Field of the Invention

The present invention relates to an analog/digital (A/D) converter, and especially relates to a successive approximation type A/D converter and a conversion method thereof.

2. Description of Related Art

When low power consumption is demanded, a successive approximation type A/D converter is widely used for various types of control LSIs such as a microcomputer. In recent years, the demands of high speed operation and high accuracy increase for an A/D converter incorporated in a highly-developed and highly-functionalized system. Thus, realization of the high speed operation and the high accuracy operation is also demanded for the successive approximation type A/D converter widely used for the purpose of low power consumption.

FIG. 1 is a diagram schematically showing a successive approximation type A/D conversion method for obtaining 2 bits at each step. In this conversion method, the conversion can be performed to achieve a given resolution in a half of the number of times of conversion, compared to a successive approximation type A/D conversion method for obtaining 1 bit at each step, thereby being able to perform a high speed conversion. The successive approximation type A/D converter is generally configured by a sample and hold circuit, a comparator, a D/A converter, a logic circuit, and a timing generation circuit. In the conversion method shown in FIG. 1, the converter is configured to be able to attain 2-bit resolution in a single comparing operation by using a 2-bit internal A/D converter having three comparison levels.

The converting operation shown in FIG. 1 will be described. A case where an analog input voltage is 9.5/16 of a reference voltage (hereinafter, the reference voltage is referred to as Vref) is shown as an example in a 4-bit A/D converter. In a first comparison period, the three comparison levels are set to (12/16)Vref, (8/16)Vref, and (4/16)Vref, respectively. When a correct determination has been performed in the first comparison period, an output of the 2-bit internal A/D converter is "10" since (9.5/16)Vref of the analog input voltage is higher than (8/16)Vref and lower than (12/16)Vref. This "10" is set to bit 3 and bit 2 of a successive approximation register, and bits 1 and 0 of a successive approximation register are set to "01", "10", and "01".

In a second comparison period, the three comparison levels are set to (11/16)Vref, (10/16)Vref, and (9/16)Vref, respectively. When a correct determination has been performed in the second comparison period, an output of the 2-bit internal A/D converter is "01" since (9.5/16)Vref of the analog input voltage is higher than (9/16)Vref and lower than (10/16)Vref. Since the result of "10" is obtained in the first comparison period and the result of "01" is obtained in the second comparison period, a final result of "1001" is obtained as the 4-bit A/D converter.

As shown in FIG. 1, in the successive approximation type A/D conversion method for obtaining 2 bits at each step, the number of times of the comparison to obtain a conversion result of N bits is no more than (N/2). However, when the determination is erroneous even once, the conversion result will be successively obtained in an incorrect search voltage range. In this case, the accuracy cannot be improved because a correct value cannot be obtained eventually. In the A/D conversion method in FIG. 1, a conversion speed is improved but there is a possibility of lowering conversion accuracy.

In "High Performance Successive Approximation ADC Architecture" (the Society for Electronic Circuit Study, ECT-06-31, Mar. 30, 2006) by Akira HAYAKAWA et al., an A/D converter is proposed in which the accuracy is improved by modifying the A/D conversion method in FIG. 1. FIG. 2 is a diagram for explaining an A/D conversion method in which even when determination has been incorrect at a former step of a comparing operation, a digital error correction can be performed at a latter step by performing the successive approximation conversion with redundancy. This A/D conversion method can be realized by using the 2-bit internal A/D converter having three comparison levels.

In a digital error compensation algorithm in the A/D conversion method of FIG. 2, when an output of the internal A/D converter in an $n^{th}$ comparison is "11", "1" is added to a comparison result in a $(n-1)^{th}$ comparison and a comparison result in the $n^{th}$ comparison is set to "0". In addition, when the output of the internal A/D converter in the $n^{th}$ comparison is "10", a comparison result in the $(n-1)^{th}$ comparison is not changed and the comparison result in the $n^{th}$ comparison is set to "1". Moreover, when the output of the internal A/D converter in the $n^{th}$ comparison is "01", the comparison result in the $(n-1)^{th}$ comparison is not changed and the comparison result in the $n^{th}$ comparison is set to "0". Furthermore, when the output of the internal A/D converter in the $n^{th}$ comparison is "00", is added to the comparison result in the $(n-1)^{th}$ comparison and the comparison result in the $n^{th}$ comparison is set to "1".

The above-mentioned converting operation will be described below by exemplifying a case where a 3-bit A/D converter whose analog input voltage is a reference voltage multiplied by 6.1/8. In a first comparison period, three comparison levels are set to (6/8)Vref, (4/8)Vref, and (2/8)Vref, respectively. When a determination indicates correct comparison in the first comparison period, an output of the internal A/D converter is "11". In the second comparison period, the three comparison levels are set to (8/8)Vref, (7/8)Vref, and (6/8)Vref, respectively. When a determination indicates correct comparison in the second comparison period, an output of the internal A/D converter is "01". By combining "11" and "01", which are the outputs of the internal A/D converter in the first comparison period and the second comparison period, a 3-bit conversion result "110" is obtained. Specifically, when the output of the internal A/D converter in the second comparison period is "01", the comparison result "01" in the second comparison period is treated as "0" without changing the comparison result "11" in the first comparison period.

Next, a case where the output of the internal A/D converter is "10" because of an erroneous determination in the first comparison period will be described. In the second comparison period, the three comparison levels are set to (6/8)Vref, (5/8)Vref, and (4/8)Vref, respectively. When a correct determination has been performed in the second comparison period, the output of the internal A/D converter is "11". By combining "10" and "11", which are the outputs of the internal A/D converter in the first comparison period and the second comparison period, a 3-bit conversion result "110" is obtained. Specifically, when the output of the internal A/D converter in the second comparison period is "11", "1" is added to the comparison result "10" in the first comparison period and the comparison result in the second comparison period is treated as "0".

In this manner, though the erroneous determination is made in the first comparison period, the conversion result "110" is same as when a correct determination is made. Since 2-bit resolution can be obtained in the first comparison period and 1-bit resolution can be obtained in second comparison period or later in the A/D conversion method in FIG. 2, the comparison of (N–1) times is only required to obtain a conversion result with N-bit resolution.

In case of the A/D conversion method shown in FIG. 2, even when an erroneous determination is made, the error can be correct in a subsequent comparing operation by providing a redundant search voltage range. Accordingly, an A/D converter can be highly-accurate. However, the number of times of the comparison increases because the comparison of (N–1) times is required to obtain a conversion result with N-bit resolution, resulting in difficulty realizing a high-speed conversion.

SUMMARY

In an aspect of the present invention, a successive approximation-type analog-to-digital converter, includes: a sampling and holding circuit configured to sample and hold an analog input voltage; a digital-to-analog converter section configured to receive current digital data corresponding to a current search voltage range, and to output a plurality of comparison voltages based on the current digital data; a comparator section (104-106) configured to perform parallel comparison in which the held analog input voltage is compared with each of the plurality of comparison voltages; a successive approximation register section configured to determine digital data for a next search voltage range within the current search voltage range based on a result of the parallel comparison using the current search voltage range, and to output the digital data as the current digital data to the digital-to-analog converter section such that the parallel comparison is successively performed; and a timing control circuit configured to generate a switching signal from the parallel comparison to a redundant comparison such that the redundant comparison is performed.

In another aspect of the present invention, an operation method of successive approximation-type analog-to-digital conversion is achieved by a sampling and holding an analog input voltage; by generating a plurality of comparison voltages based on a current digital data corresponding to a current search voltage range; by performing a parallel comparison in which the held analog input voltage is compared with each of the plurality of comparison voltages; by generating digital data for a next search voltage range within the current search voltage range based on a result of the parallel comparison using the current search voltage range, such that the parallel comparison is successively performed; and by generating a switching signal from the parallel comparison to a redundant comparison such that the redundant comparison is performed.

According to the present invention, a highly-accurate analog/digital conversion can be realized at a high speed.

BRIEF DESCRIPTION OF THE DRAWINGS

The above and other objects, advantages and features of the present invention will be more apparent from the following description of certain embodiments taken in conjunction with the accompanying drawings, in which;

FIGS. 14A and 14B ate a flowchart to explain a converting operation according to the second embodiment;

DESCRIPTION OF PREFERRED EMBODIMENTS

Hereinafter, a successive approximation type analog/digital converter according to the present invention will be described with reference to the attached drawings.

First Embodiment

Figure 3:
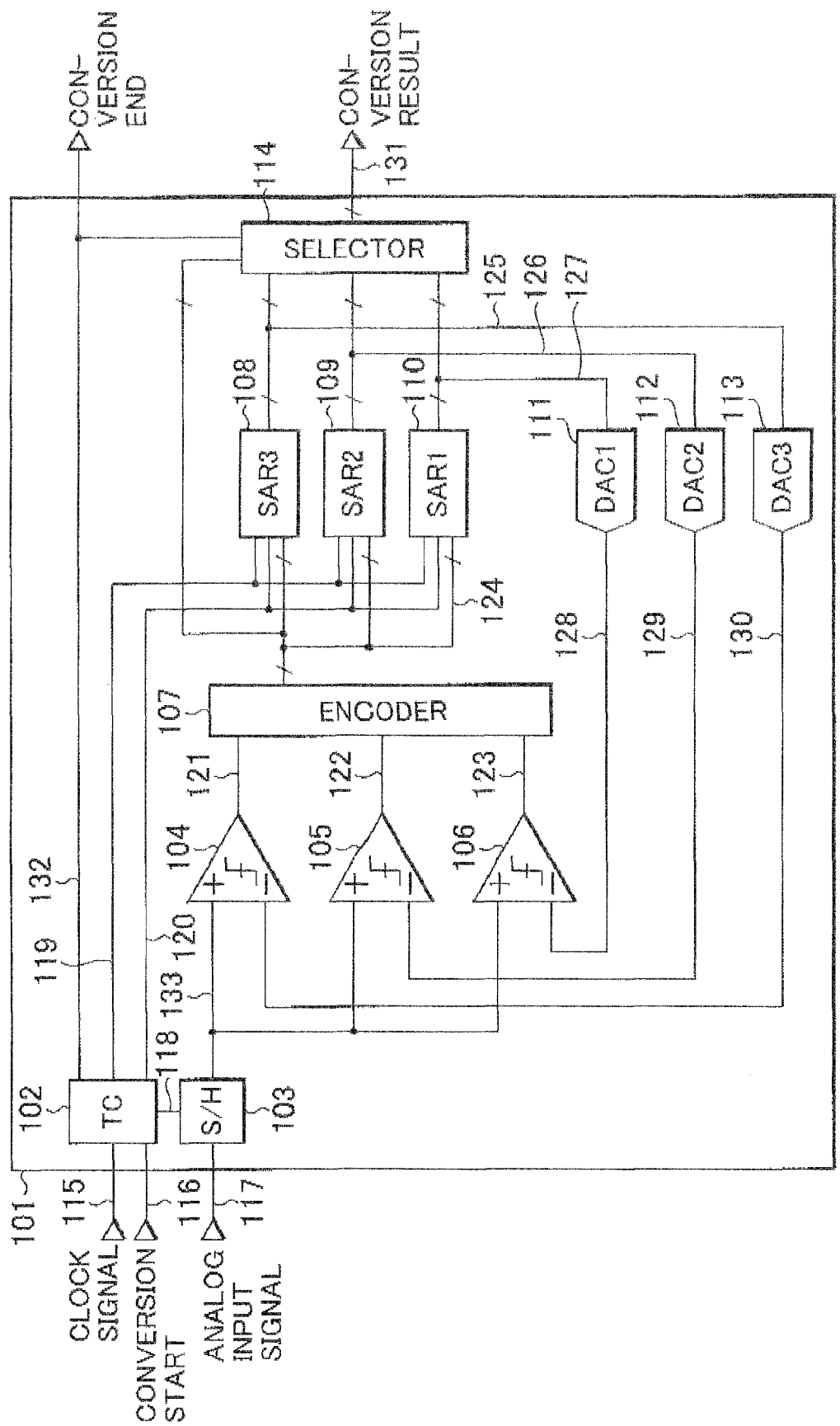
FIG. 3 is a block configuration view of a successive approximation type A/D converter according to a first embodiment of the present invention.

FIG. 3 shows a circuit configuration of the successive approximation type A/D converter 101 according to a first embodiment of the present invention. The successive approximation type A/D converter 101 shown in FIG. 3 includes three D/A converters 111 to 113 for outputting three comparison signal voltages, three comparators 104 to 106 for performing comparison with the three comparison signal voltages, an encoder 107 for encoding the outputs 121 to 123 of the three comparators 104 to 106, and successive approximation registers (SAR) 108 to 110.

In FIG. 3, a timing control circuit 102 controls operation timing of the successive approximation type A/D converter 101. As shown in FIG. 3, the timing control circuit 102 receives a clock signal 115 and a conversion start signal 116 and outputs a sampling signal 118 to a sample and hold circuit 103, a control signal 119 to the successive approximation resisters 108, 109, and 110, an operation clock signal 120 to the successive approximation resisters 108, 109, and 110, and a conversion end signal 132 to the outside.

The sample and hold circuit 103 samples an analog input signal 117 and holds the sampled signal voltage. The comparators 104, 105, and 106 compare the output 133 of the sample and hold circuit 103 with the outputs voltages 128, 129, and 130 of the D/A converters 111, 112, and 113, respectively. The encoder 107 encodes the outputs 121, 122, 123 of the comparators 104, 105, 106. The D/A converters 111, 112, 113 are controlled by the successive approximation registers 108, 109, and 110, respectively. A selector 114 selects any one of the outputs 127, 126, and 125 of the successive approximation registers 110, 109, and 108, and outputs it as an A/D conversion result 131. The successive approximation resisters 108, 109, and 110 and the selector 114 receive the output 124 encoded by the encoder 107. The D/A converters 111, 112, and 113 receive the outputs 127, 126, and 125 of the successive approximation registers 110, 109, and 108, respectively.

The D/A converter 113 outputs the highest voltage of the three D/A converters 111, 112, and 113, the D/A converter 112 outputs a middle voltage, and the D/A converter 111 outputs the lowest voltage. When the output voltage 133 of the sample and hold circuit 103 is lower than the lowest voltage of the output 128 of the D/A converter 111, all of the outputs 121, 122, and 123 of the comparators 104, 105, and 106 become "0" and the output 124 of the encoder 107 becomes "00". When the output voltage 133 of the sample and hold circuit 103 is higher than the output voltage 128 of the D/A converter 111 and is lower than the middle voltage as the output 129 of the D/A converter 112, the outputs 121 and 122 of the comparators 104 and 105 become "0" and the output 123 of the comparator 106 becomes "1". In this case, the output 124 of the encoder 107 is "01". When the output voltage 133 of the sample and hold circuit 103 is higher than the middle voltage as the output of the D/A converter 112 and is lower than the highest voltage as the output 130 of the D/A converter 113, the output 121 of the comparators 104 becomes "0" and the outputs 122 and 123 of the comparators 105 and 106 become "1". In this case, the output 124 of the encoder 107 becomes "10". When the output voltage 133 of the sample and hold circuit 103 is higher than the highest voltage as the output 130 of the D/A converter 113, all of the outputs 121, 122, and 123 of the comparators 104, 105, and 106 become "1" and the output 124 of the encoder 107 becomes "11".

Figure 4:
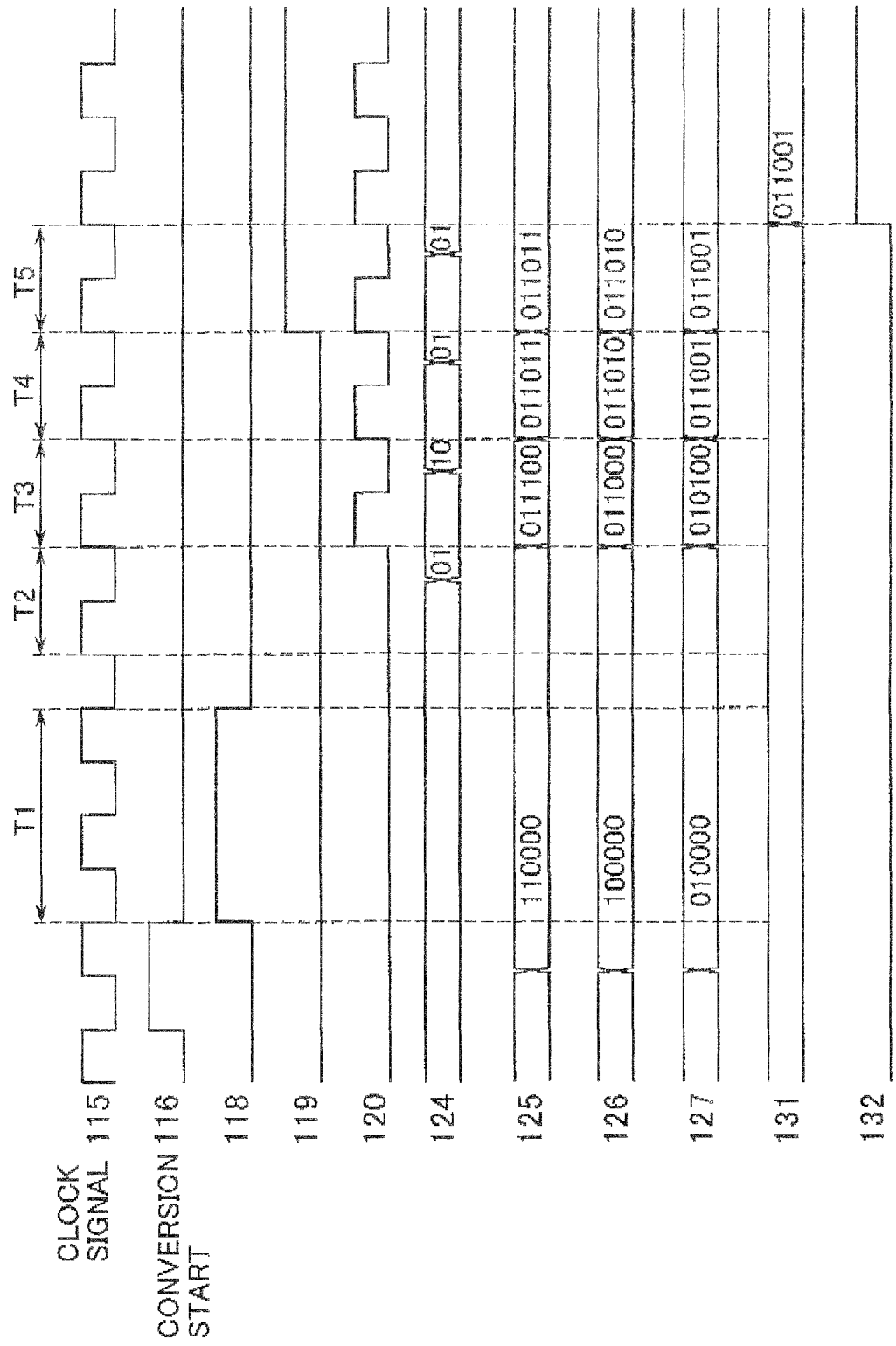
FIG. 4 is a time chart to explain an operation of the successive approximation type A/D converter of FIG. 3.
Figure 5:
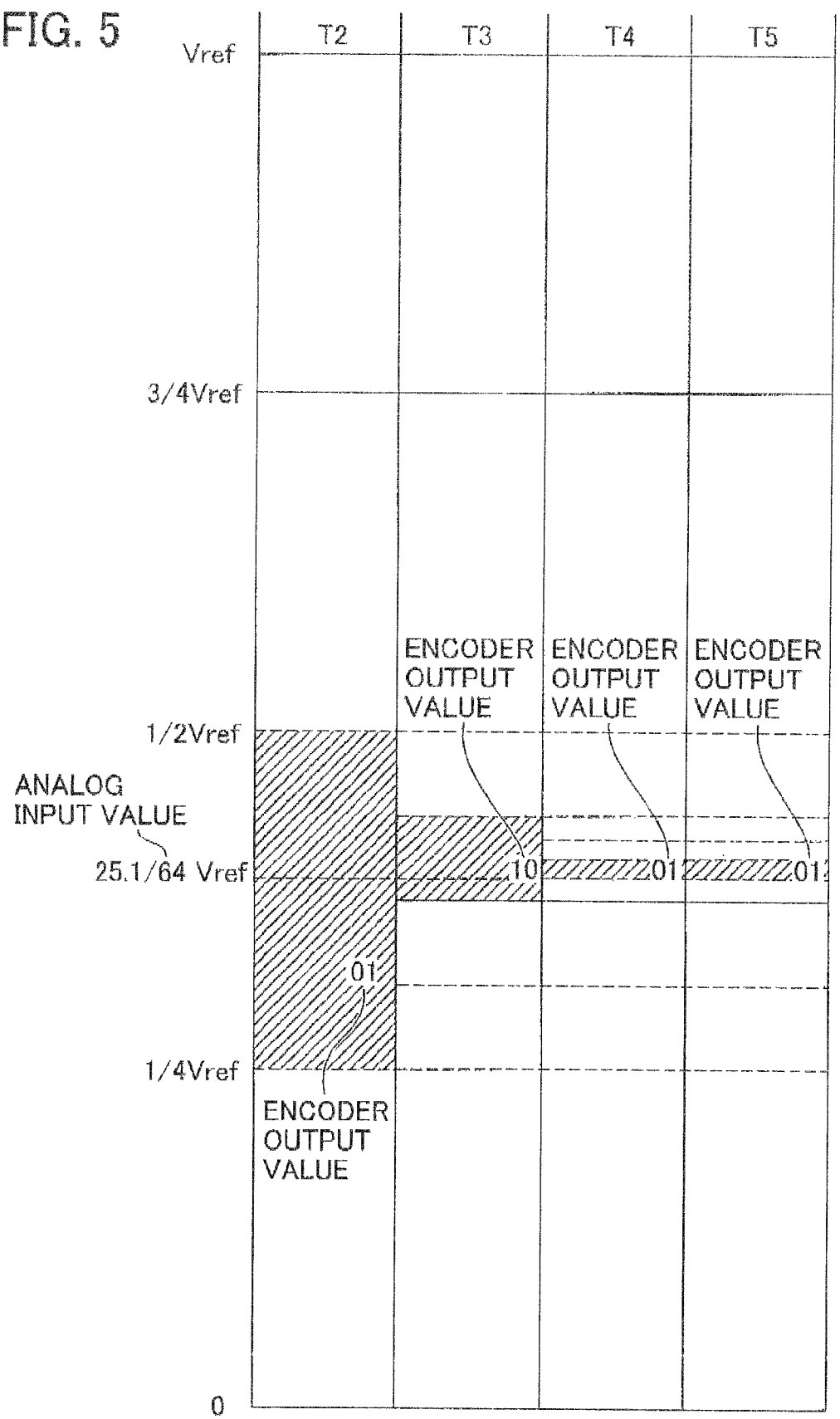
FIG. 5 is an explanation view showing a change of a search voltage range in a case of an operation example of FIG. 4.

FIG. 4 shows an example of operation timings of the successive approximation type A/D converter 101 of FIG. 3, and FIG. 5 shows change of a search voltage range in the operation example of FIG. 4. Here, an operation of the successive approximation type A/D converter 101 having 6-bit resolution will be described as an example. In FIG. 5, a vertical axis represents an internal comparison voltage range of the successive approximation type A/D converter 101, and a horizontal axis represents passage of time. A hatching region represents selected voltage ranges in respective comparison periods.

In FIG. 4, when the conversion start signal 116 becomes "1", the successive approximation type A/D converter 101 starts the operation in synchronization with the clock signal 115. In FIG. 4, the sampling signal 118 becomes "1" during a period T1, and the sample and hold circuit 103 samples the analog input signal 117. When the sampling signal 118 become "0" after the period T1 ends, the sample and hold circuit 103 holds and outputs the sampled voltage as the output 133.

The successive approximation resisters 108, 109, and 110 designate voltages outputted from the corresponding D/A converters 113, 112, and 111. In a first comparison period (period T2), values "11", "10", and "01" are set to bits 5 and 4 of the successive approximation registers 108, 109, and 110, respectively, to compare the sampled voltage with 3/4, 2/4 and 1/4 of a reference voltage Vref. Specifically, the values 125, 126, and 127 of the successive approximation resisters 108, 109, and 110 become "110000", "100000", and "010000", respectively. The comparators 104, 105, and 106 compare voltages of the outputs 130, 129, and 128 of the D/A converters 113, 112, and 111 with the output voltage 133 of the sample and hold circuit 103, respectively. If the voltage of the analog input signal 117 is 25.1/64)Vref, the voltage is higher than (1/4)Vref and lower than (2/4)Vref. Accordingly, the outputs 121 and 122 of the comparators 104 and 105 become "0", the output 123 of the comparator 106 becomes "1", and the output 124 of the encoder 107 becomes "01".

In FIG. 5, the first comparison period corresponds to a comparison period T2. Referring to the comparison period T2 in FIG. 5, it is shown that the comparison voltage range is from Vref to 0, and the output 124 of the encoder 107 becomes "01" since the voltage of the analog input signal 117 is higher than (1/4)Vref and lower than (2/4)Vref.

In a second comparison period (period T3), the value "01" as the output 124 of the encoder 107 in the first comparison period (period T2) is set to the bits 5 and 4 of the successive approximation resisters 108, 109, and 110. In addition, values "11", "10", and "01" are set to bits 3 and 2 of the successive approximation registers 108, 109, and 110 in the similar manner to the first comparison period (period T2). Specifically, the values 125, 126, and 127 of the successive approximation resisters 108, 109, and 110 become "011100", "011000", and "010100", respectively. The outputs 130, 129, and 128 of the D/A converters 113, 112, and 111 become (7/16)Vref, (6/16)Vref, and (5/16)Vref, respectively, and the comparators 104, 105, and 106 compare these voltages with the output voltage 133 of the sample and hold circuit 103, respectively. That is, the voltage range, "higher than (1/4) Vref and lower than (2/4)Vref", obtained in the first comparison period (period T2) is searched in more detail. When the voltage of the analog input signal 117 is (25.1/64)Vref, the voltage is higher than (6/16)Vref and lower than (7/16)Vref. Accordingly, the output 121 of the comparator 104 becomes "0", the outputs 122 and 123 of the comparators 105 and 106 become "1", and the output 124 of the encoder 107 becomes "10".

In FIG. 5, the second comparison period corresponds to a comparison period T3. Referring to the comparison period T3 in FIG. 5, it is shown that the comparison voltage range is from (8/16)Vref to (4/16)Vref, and the output 124 of the encoder 107 becomes "10", since the voltage of the analog input signal 117 is higher than (6/16)Vref and lower than (7/16)Vref.

In a third comparison period (period T4), the value "10" as the output 124 of the encoder 107 in the second comparison period (period T3) is set to the bits 3 and 2 of the successive approximation resisters 108, 109, and 110. In addition, values "11", "10", and "01" are set to bits 1 and 0 of the successive approximation resisters 108, 109, and 110 in the similar manner to the first comparison period (period T2) and the second comparison period (period T3). Specifically, the values 125, 126, and 127 of the successive approximation resisters 108, 109, and 110 become "011011", "011010", and "011001", respectively. The outputs 130, 129, and 128 of the D/A converters 113, 112, and 111 become (27/64)Vref, (26/64)Vref, and (25/64)Vref, respectively, and the comparators 104, 105, and 106 compare these voltages with the voltage of the output 133 from the sample and hold circuit 103, respectively. That is, the voltage range, "higher than (6/16)Vref and lower than (7/16)Vref", obtained in the second comparison period (period T3) is searched in more detail. When the voltage of the analog input signal 117 is (25.1/64)Vref, the voltage is higher than (25/64)Vref and lower than (26/64)Vref. Accordingly, the outputs 121 and 122 of the comparators 104 and 105 become "0", the output 123 of the comparator 106 becomes "1", and the output 124 of the encoder 107 becomes "01".

In FIG. 5, the third comparison period corresponds to comparison period T4. Referring to comparison period T4 in FIG. 5, it is shown that the comparison voltage range is from (28/64)Vref to (24/64)Vref, and the output 124 of the encoder 107 becomes "01", since the voltage of the analog input signal 117 is higher than (25/64)Vref and lower than (26/64)Vref.

After the three comparison periods, values of all bits of the conversion result are obtained. However, since there is a possibility of erroneous determination in previous comparison periods, the A/D converting operation is performed by adding a redundant comparison period (period T5). Since the value as the output 124 of the encoder 107 in the third comparison period (period T4) is "01" in a fourth comparison period (period 15), it can be determined that the voltage of the analog input signal 117 is not out of the search voltage range in the third comparison period (period T4) (the range higher than (8/16)Vref and lower than (9/16)Vref). Then, the values 125, 126, and 127 of the successive approximation resisters 108, 109, and 110 are set to the unchanged values in the third comparison period (period T4), that is, "011011", "011010", and "011001". The voltages of the outputs 130, 129, and 128 of the D/A converters 113, 112, and 111 are also the same as those in the third comparison period (period T4) and become (27/64)Vref, (26/64)Vref, and (25/64)Vref, respectively. The comparators 104, 105, and 106 compare these voltages with the voltage of the output 133 of the sample and hold circuit 103, respectively. That is, the voltage range, "higher than (6/16)Vref and lower than (7/16)Vref", obtained in the second comparison period (period T3) is searched in more detail. When the voltage of the analog input signal 117 is (25.1/64) Vref, the voltage is higher than (25/64) Vref and lower than (26/64)Vref. Accordingly, the outputs 121 and 122 of the comparators 104 and 105 become "0", the output 123 of the comparator 106 become "1", and the output 124 of the encoder 107 becomes "01".

In FIG. 5, the redundant comparison in the fourth comparison period corresponds to a comparison period T5. Referring to the comparison period T5 in FIG. 5, it is shown that the comparison voltage range is from (28/64)Vref to (24/64) Vref, and the output 124 of the encoder 107 becomes "01", since the voltage of the analog input signal 117 is higher than (25/64)Vref and lower than (26/64)Vref.

After the four comparison periods, the timing control circuit 102 sets the conversion end signal 132 to "1". Since the value of the output 124 of the encoder 107 in the fourth comparison period (period T5) is "01", the selector 114 selects a lower value of the successive approximation register 110, that is, "011001". The successive approximation type A/D converter 101 outputs "011001" as the A/D conversion result 131.

Figure 6:
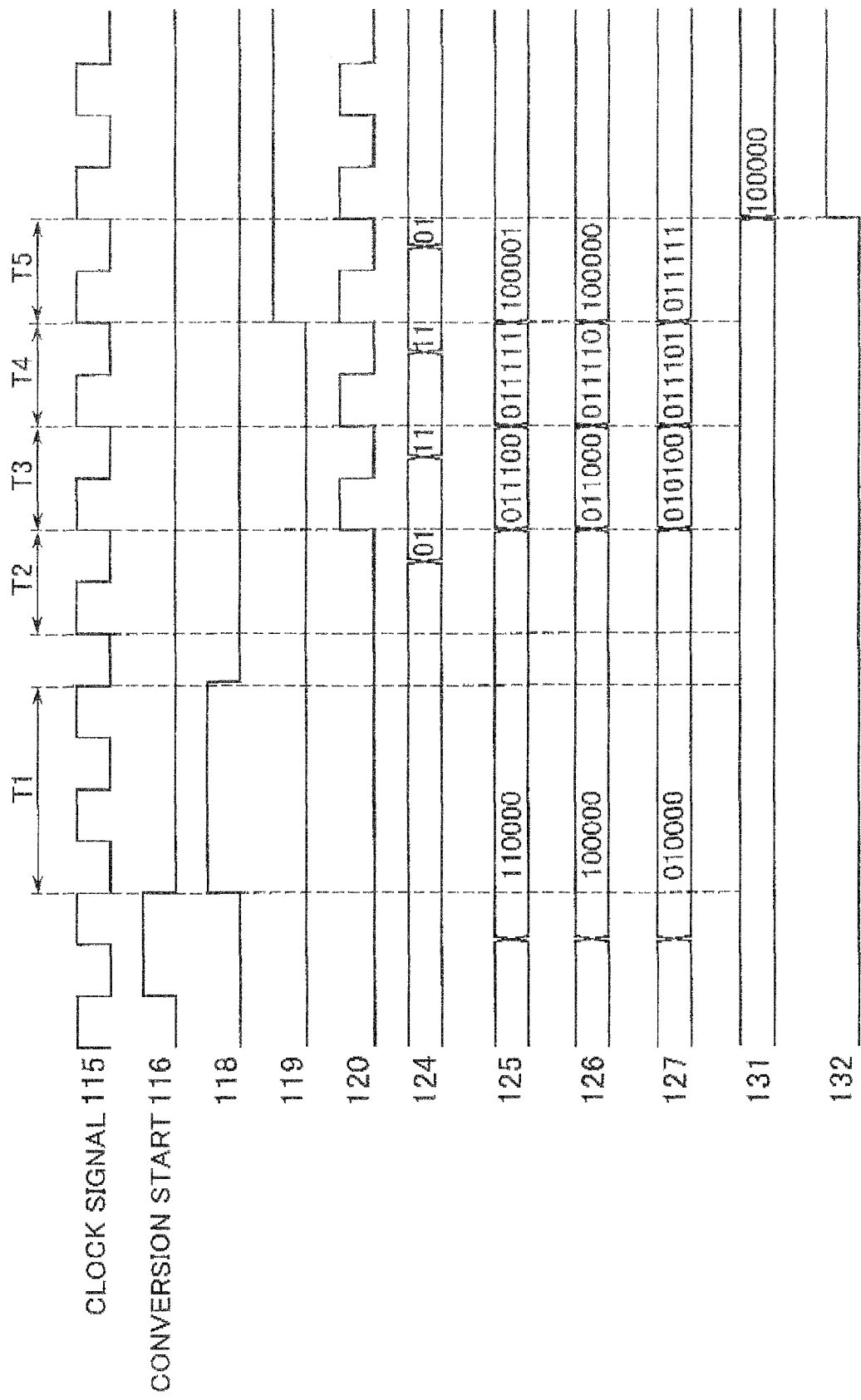
FIG. 6 is a time chart to explain an operation of a case where the successive approximation type A/D converter of FIG. 3 made an erroneous determination in comparison in midstream.
Figure 7:
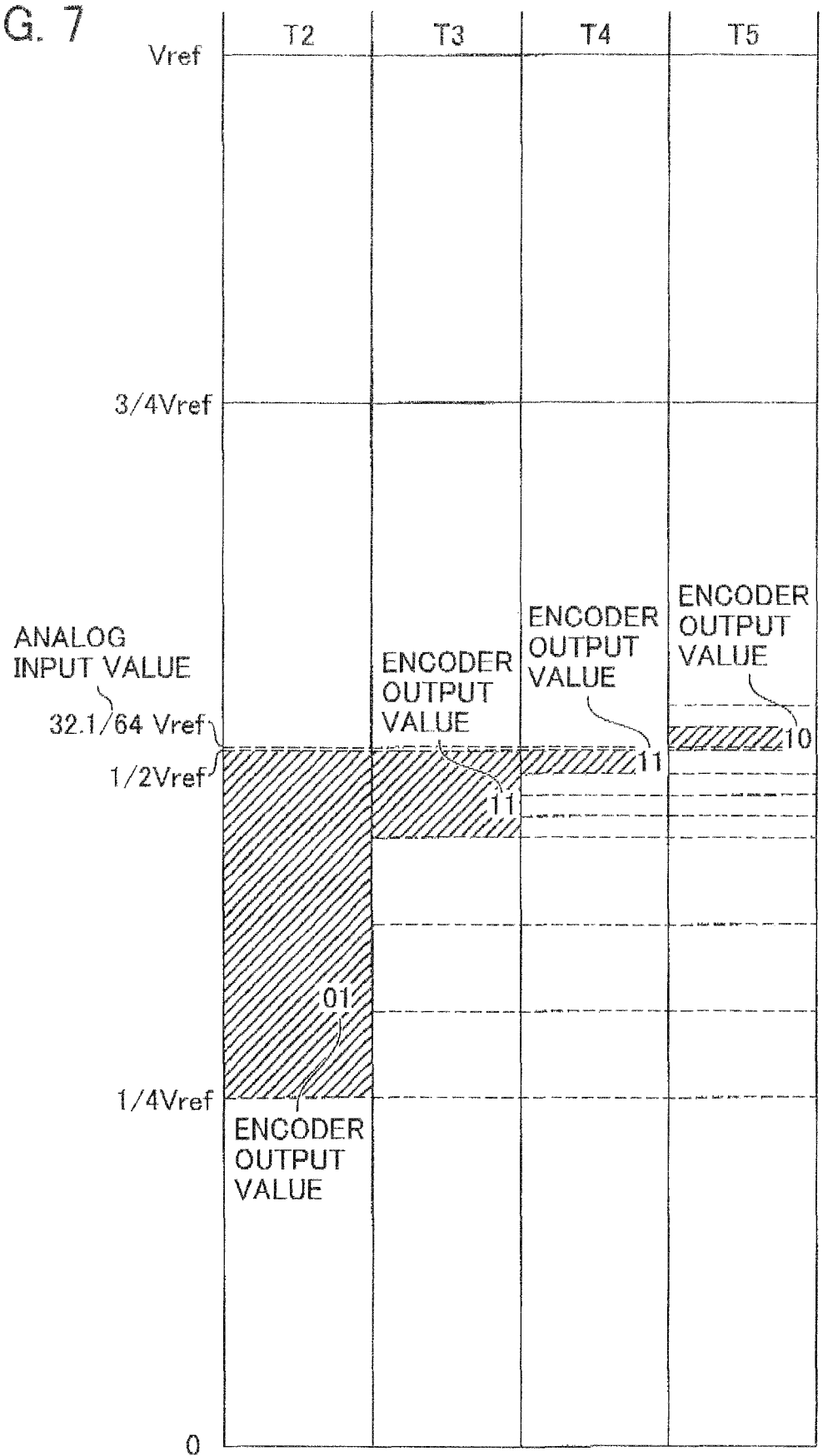
FIG. 7 is an explanation view showing a change of a search voltage range in a case of the operation example of FIG. 6.

FIG. 6 shows an example of operation timings in an erroneous determination on the way of comparison, and FIG. 7 shows change of the search voltage range in the operation example of FIG. 6. Here, the operation when the voltage of the analog input signal 117 is (32.1/64)Vref will be described. In FIG. 7, a vertical axis represents an internal comparison voltage range of the successive approximation type A/D converter 101, and a horizontal axis represents passage of time. A hatching portion represents selected voltage ranges in respective comparison periods.

As shown in FIG. 6, since an operation before the period T2 is the same as the operation of FIG. 4, the description will start from the operation of period T2. In the first comparison period (period T2), comparisons with (3/4)Vref, (2/4)Vref, and (1/4) Vref are performed. Since the voltage of the analog input signal 117 is (32.1/64)Vref, the voltage is higher than (2/4) Vref and lower than (3/4)Vref. Accordingly, the output 124 of the encoder 107 normally has to be "10" in the first comparison period (period T2). However, in case of high resolution and in case of a high conversion speed, for example, the comparator 105 with a small voltage difference for determination sometimes makes erroneous determination. In FIG. 6, the output 124 of the encoder 107 is "01" because of the erroneous determination.

In FIG. 7, the first comparison period corresponds to the comparison period T2. Referring to the comparison period T2 in FIG. 7, it is shown that the comparison voltage range is from Vref to 0, the voltage of the analog input signal 117 is higher than (1/4)Vref and lower than (2/4)Vref, and the output 124 of the encoder 107 becomes "01".

In the second comparison period (period T3), the value "01" of the output 124 of the encoder 107 in the first comparison period (period T2) is set to the bits 5 and 4 of the successive approximation resisters 108, 109, and 110. In addition, values "11", "10", and "01" are set to bits 3 and 2 of the successive approximation resisters 108, 109, and 110 in the similar manner to the first comparison period (period T2). Specifically, the values 125, 126, and 127 of the successive approximation resisters 108, 109, and 110 become "011100", "011000", and "010100", respectively. The voltages of the outputs 130, 129, and 128 of the D/A converters 113, 112, and 111 become (7/16)Vref, (6/16)Vref, and (5/16)Vref, respectively. The comparators 104, 105, and 106 compares these voltages with the voltage of the output 133 of the sample and hold circuit 103, respectively. That is, the voltage range, "higher than (1/4)Vref and lower than (2/4)Vref", obtained in the first comparison period (period T2) is searched in more detail. When the voltage of the analog input signal 117 is (32.1/64)Vref, since the voltage is higher than (7/16)Vref, all of the outputs 121, 122, and 123 of the comparators 104, 105, and 106 become "1" and the output 124 of the encoder 107 becomes "11".

In FIG. 7, the second comparison period corresponds to the comparison period T3. Referring to the comparison period T3 in FIG. 7, though the comparison voltage range is normally from (12/16)Vref to (8/16)Vref, the comparator 105 made erroneous determination in the first comparison period (period T2) and thus the range is from (8/16)Vref to (4/16)Vref. Since the voltage of the analog input signal 117 is higher than (7/16)Vref, the output 124 of the encoder 107 is "11".

In the third comparison period (period T4), the value "11" of the output 124 of the encoder 107 in the second comparison period (period T3) is set to the bits 3 and 2 of the successive approximation resisters 108, 109, and 110. In addition, values "11", "10", and "01" are set to bits 1 and 0 of the successive approximation resisters 108, 109, and 110 in the similar manner to the first comparison period (period T2) and the second comparison period (period T3). Specifically, the values 125, 126, and 127 of the successive approximation resisters 108, 109, and 110 become "011111", "011110", and "011101", respectively. The voltages of the outputs 130, 129, and 128 of the D/A converters 113, 112, and 111 become (31/64)Vref, (30/64)Vref, and (29/64)Vref, respectively, and the comparators 104, 105, and 106 compares these voltages with the voltage of the output 133 of the sample and hold circuit 103, respectively. That is, the voltage range, "higher than (7/16) Vref and lower than (8/16)Vref", obtained in the first comparison period (period T2) and the second comparison period (period T3) is searched in more detail. When the voltage of the analog input signal 117 is (32.1/64)Vref, all of the outputs 121, 122, and 123 of the comparators 104, 105, and 106 become "1" and the output 124 of the encoder 107 becomes "11", since the voltage is higher than (31/64)Vref.

In FIG. 7, the third comparison period corresponds to the comparison period T4. Referring to the comparison period T4 in FIG. 7, it is shown that the comparison voltage range is from (8/16)Vref to (7/16)Vref, and the output 124 of the encoder 107 becomes "11", since the voltage of the analog input signal 117 is higher than (31/64)Vref.

In the fourth comparison period (period T5), since the value of the output 124 of the encoder 107 in the third comparison period (period T4) is "11", it can be determined that the voltage of the analog input signal 117 may be out of the search voltage range in the third comparison period (period T4) (the range higher than (7/16)Vref and lower than (2/4) Vref). Then, the values of the successive approximation resisters 108, 103, and 110 are reset to values obtained by adding "10", and the search voltage range is reset. Specifically, the value 125 of the successive approximation register 108 becomes "100001" by adding "10" to "011111", the value 126 of the successive approximation register 109 becomes "100000" by adding "10" to "011110", and the value 127 of the successive approximation register 110 becomes "011111" by adding "10" to "011101". The voltages of the outputs 130, 129, and 128 of the D/A converters 113, 112, and 111 becomes (33/64)Vref, (32/64)Vref, and (31/64) Vref, respectively, and the comparators 104, 105, and 106 compare these voltages with the voltage of the output 133 of the sample and hold circuit 103, respectively. That is, the search voltage range in the third comparison period (period T4) (the range higher than (7/16)Vref and lower than (8/16) Vref) is set again, and the search voltage range, "higher than (30/64)Vref and lower than (34/64)Vref", is searched in more detail. When the voltage of the analog input signal 117 is (32.1/64)Vref, the output 121 of the comparator 104 becomes "1" and the outputs 122 and 123 of the comparators 105 and 106 become "0", thereby the output 124 of the encoder 107 becomes "10", since the voltage is higher than (32/64)Vref and lower than (33/64)Vref.

In FIG. 7, the fourth comparison period corresponds to the comparison period T5. Referring to the comparison period T5 in FIG. 7, it is shown that the comparison voltage range is from (34/64)Vref to (30/64)Vref, and the output 124 of the encoder 107 become "10" since the voltage of the analog input signal 117 is higher than (32/64)Vref and lower than (33/64)Vref.

After the four comparisons, the timing control circuit 102 sets the conversion end signal 132 to be "1" and outputs the signal. Since the value of the output 124 of the encoder 107 in the fourth comparison period (period T5) is "10", the selector 114 selects a middle value of the successive approximation register 109, that is, "100000" to compensate the conversion value. The successive approximation type A/D converter 101 outputs "100000" as the A/D conversion result 131.

Figure 8:
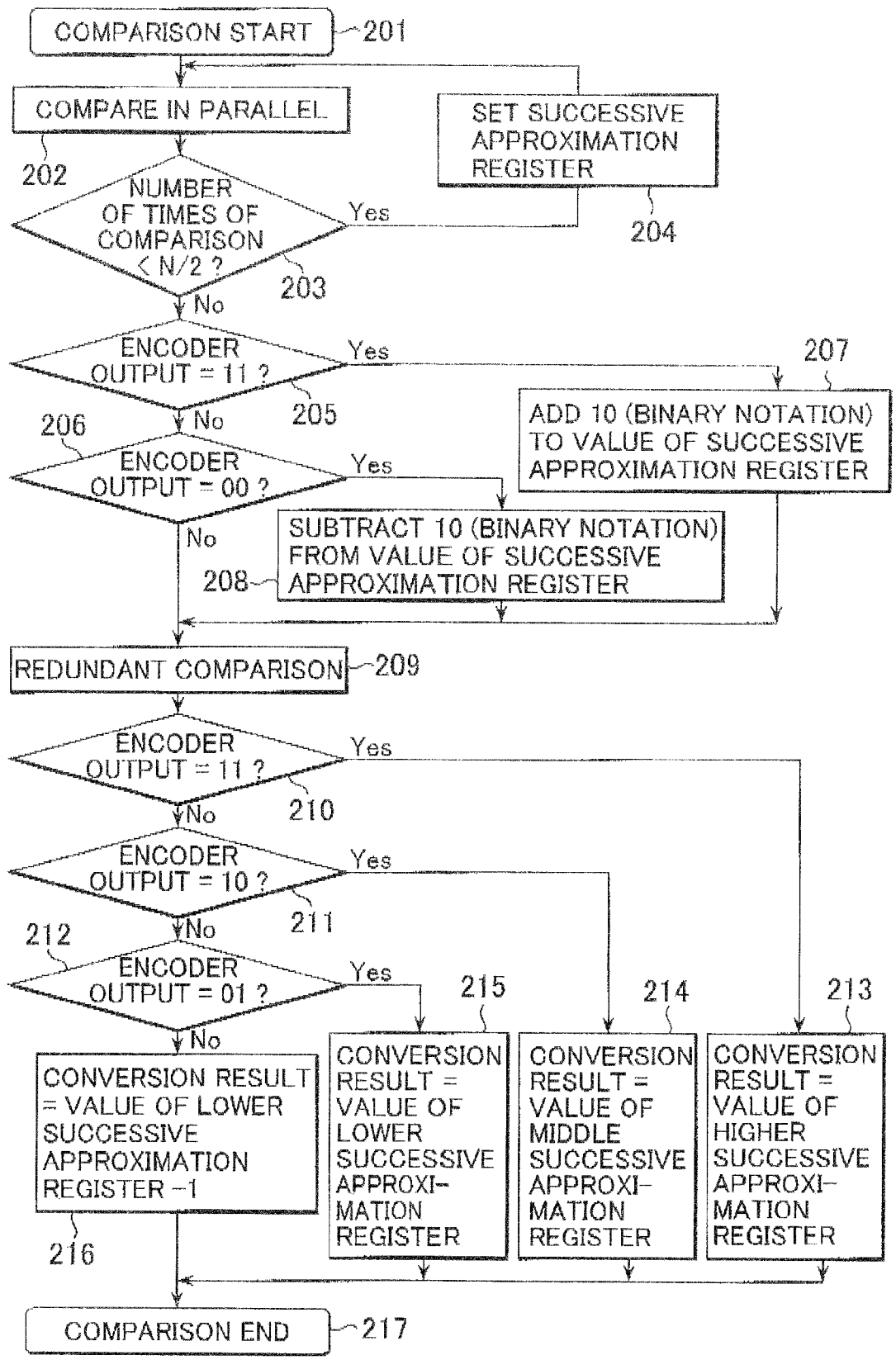
FIG. 8 is a flowchart to explain a converting operation according to the first embodiment.

FIG. 8 shows a flowchart to show a converting operation of the converter 101 according to the first embodiment. In FIG. 8, the comparison starts from step 201. At a step 202, 2-bit comparison is performed in parallel by using three D/A converters 111 to 113 and three comparators 104 to 106. At a step 203, it is determined whether or not the parallel comparison has been completed a predetermined number of times ((N/2) times in case of the A/D converter with N-bit resolution). When the number of times of parallel comparison is less than the predetermined number of times, a comparison result is set to the successive approximation register and a voltage used in next comparison is determined. That is, a binary search by 2 bits is performed by repeating flows 202, 203, and 204 the predetermined number of times.

When it is determined at the step 203 that the parallel comparison has been completed the predetermined number of times, the process flow proceeds to a step 205 or later. Here, the search voltage range of the redundant comparison operation is switched to be reset to a higher voltage side, to be reset to a lower voltage side, or not to be reset. When the last encoder output of the parallel comparison is "11", the process flow proceeds from the step 205 to a step 207, and "10" is added to a value of the successive approximation register. That is, the search voltage range is reset to the higher voltage side and a redundant comparison at a step 209 is performed. When the encoder output in the last of the parallel comparison is "00", the process flow proceeds from the step 206 to a step 208, and "10" is subtracted from the value of the successive approximation register. That is, the search voltage range is reset to the lower voltage side and the redundant comparison at the step 209 is performed. When the last encoder output of the parallel comparison is "01" or "10", the redundant comparison at the step 209 is performed without changing the value of the successive approximation register and resetting the search voltage range.

When the redundant comparison at the step 209 is completed, a final conversion result is determined based on the encoder output. When the encoder output is "11", the process flow proceeds from a step 210 to a step 213, a higher value of the successive approximation register is selected as the conversion result, and the process flow proceeds to end of comparison at a step 217. When the encoder output is "10", the process flow proceeds from a step 211 to a step 214, a middle value of the successive approximation register is selected as the conversion result, and the process flow proceeds to end of comparison at the step 217. When the encoder output is "01", the process flow proceeds from a step 212 to a step 215, a lower value of the successive approximation register is selected as the conversion result, and the process flow proceeds to end of comparison at the step 217. When the encoder output is "00", the process flow proceeds from the step 212 to the step 216, a value obtained by subtracting "1" from the lower value of the successive approximation register is selected as the conversion result, and the process flow proceeds to end of comparison at the step 217.

Figure 1:
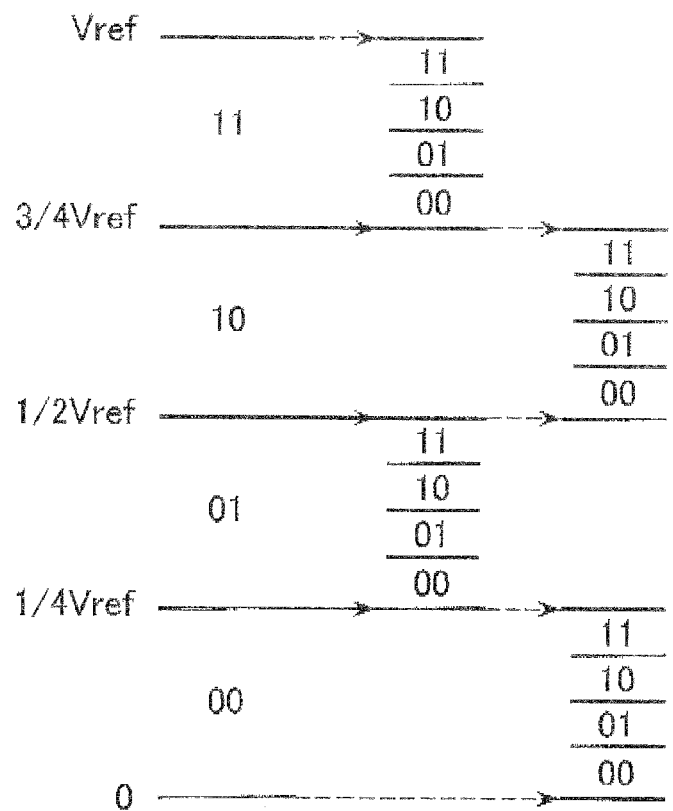
FIG. 1 is an explanation view of a conversion method according to a conventional successive approximation type A/D converter.
Figure 2:
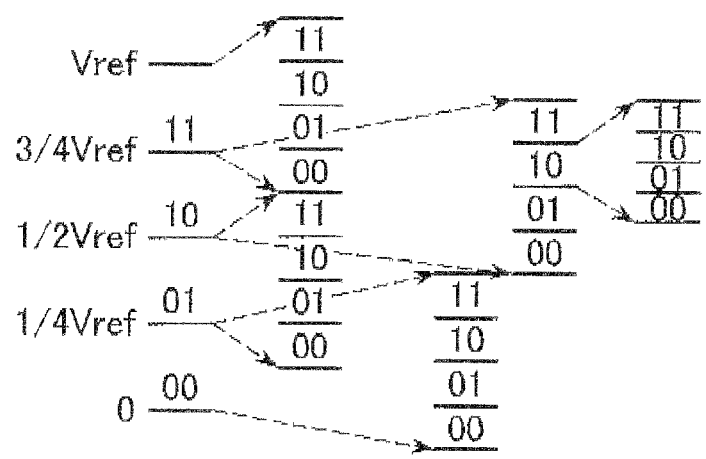
FIG. 2 is an explanation view of a digital error compensation algorithm in a conventional A/D conversion method.

According to the A/D conversion method of the successive approximation type A/D converter in the first embodiment, the redundant search voltage range is reset based on a result of the parallel comparison as shown at the steps 205 to 208 after performing a parallel comparison (high-speed comparison) the predetermined number of times by a D/A converter which can output a plurality of comparison voltages and a plurality of comparators. Then, a redundant comparison shown at the step 209 is performed to obtain a final conversion result based on the steps 210 to 216. In this manner, since a correct conversion result can be obtained even when erroneous determination has been made in the successive parallel comparison, an accuracy of the successive approximation type A/D converter can be improved. In addition, compared to the conversion method of FIG. 2, extremely high speed conversion can be realized.

Figure 9:
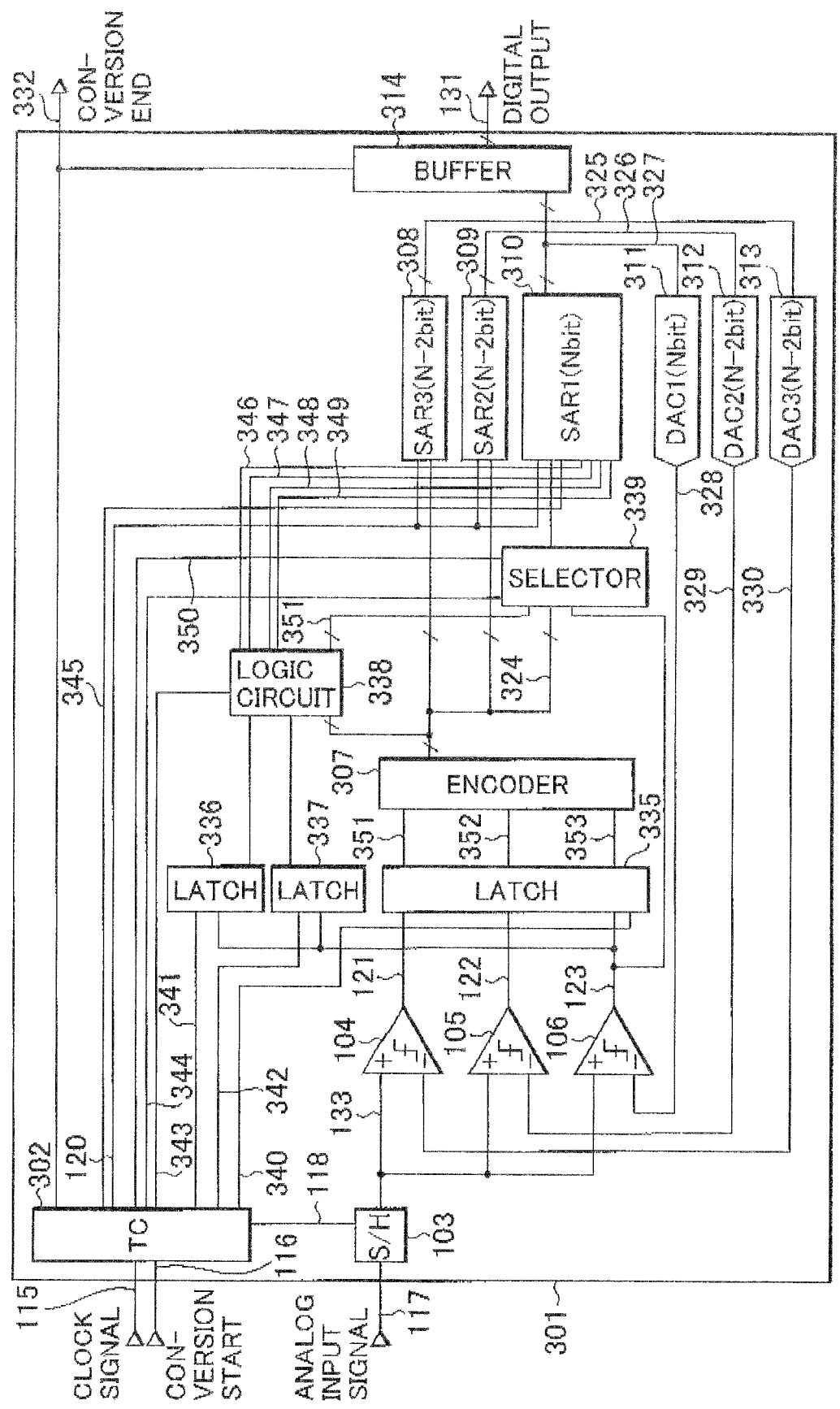
FIG. 9 is a block configuration view of a successive approximation type A/D converter according to a second embodiment of the present invention.

FIG. 9 shows a circuit configuration of a successive approximation type A/D converter 301 according to a second embodiment of the present invention. The successive approximation type A/D converter 301 shown in FIG. 9 is different from the successive approximation type A/D converter 101 in that the number of bits of two successive approximation resisters 308 and 309 among three successive approximation registers 308, 309, and 310 is reduced by 2 bits, and resolution of two D/A converters 312 and 313 among three D/A converter 311, 312, and 313 is reduced by 2 bits.

In the second embodiment, a latch 335 for holding the outputs 121, 122, and 123 as comparison results of the comparators 104, 105, and 106 in the last of the parallel comparison, a latch 336 for holding the output 123 as a comparison result of the comparator 106 in a first redundant comparison, a latch 337 for holding the output 123 as a comparison result of the comparator 106 in a second redundant comparison, a logic circuit 338, and a selector 339 are added.

In addition, a timing control circuit (TC) 302 according to the second embodiment additionally outputs a latch signal 340 that is "1" at a latch timing of the latch 335, a latch signal 341 that is "1" at latch timing of the latch 336, a latch signal 342 that is "1" at latch timing of the latch 337, a control signal 343 to indicate a timing when "1" is added to or subtracted from the successive approximation register 310, a selection signal 344 to select the output 351 of the logic circuit 338 as a value set to the successive approximation register 310, a control signal 345 to switch whether the successive approximation register 310 operates by 2 bits at a time or by 1 bit at a time, and a selection signal 350 to select the output 123 of the comparator 106 as a value set to the successive approximation register 310.

Also, the logic circuit 338 outputs an addition signal 346 to add "1" to a value of the successive approximation register 310, a subtraction signal 347 to subtract "1" from the value of the successive approximation register 310, a carry signal 348 to carry a bit 4 of the successive approximation register 310, and a borrow signal 349 to borrow the bit 4 of the successive approximation register 310.

Figure 10:
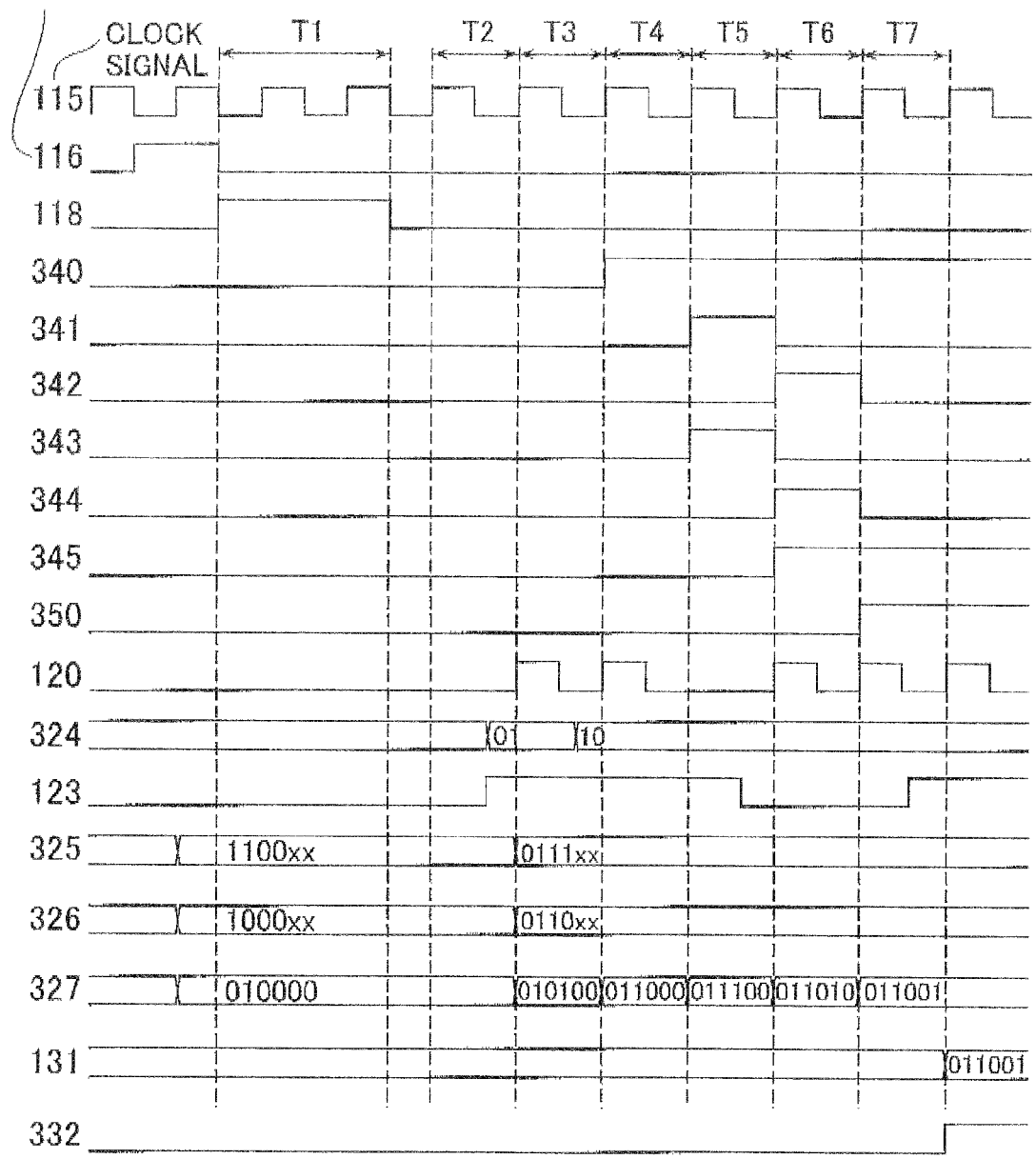
FIG. 10 is a time chart to explain an operation of the successive approximation type A/D converter of FIG. 9.
Figure 11:
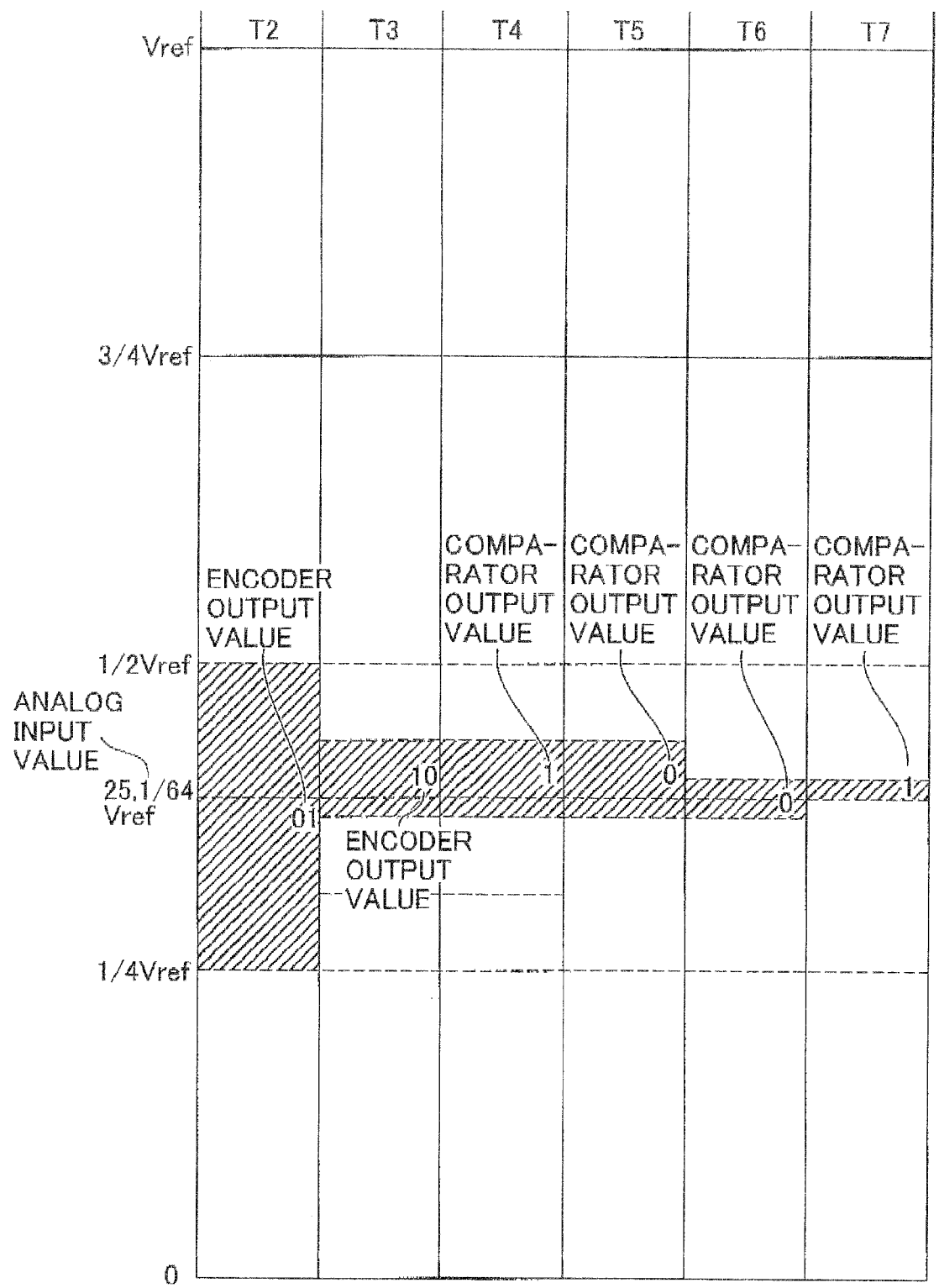
FIG. 11 is an explanation view showing a change of a search voltage range in a case of the operation example of FIG. 10.

FIG. 10 shows an example of operation timings of the successive approximation type A/D converter 301 of FIG. 9, and FIG. 11 shows change of the search voltage range in case of the operation example of FIG. 10. Here, the successive approximation type A/D converter 301 having 6-bit resolution will be described as an example. In FIG. 11, a vertical axis represents an internal comparison voltage range of the successive approximation type A/D converter 301, and a horizontal axis represents passage of time. A hatching portion represents a selected voltage range in respective comparison periods.

When the conversion start signal 116 becomes "1", the successive approximation type A/D converter 301 starts an operation in synchronization with the clock signal 115. As shown in FIG. 10, the sampling signal 118 outputted by the timing control circuit 302 is "1" during the period T1, and the sample and hold circuit 103 samples and holds a voltage of the analog input signal 117. When the sampling signal 118 becomes "0" after the period T1 ends, the sample and hold circuit 103 holds a sampled voltage as the output 133 of the sample and hold circuit 103.

The successive approximation resisters 308, 309, and 310 designate voltages outputted from the corresponding D/A converters 313, 312, and 311. In the first comparison period (period T2), values "11", "10", and "01" are set to bits 5 and 4 of the successive approximation resisters 308, 309, and 310, respectively, to compare the sampled voltage with voltages of 3/4, 2/4 and 1/4 of a reference voltage Vref. Specifically, the values 325, 326, and 327 of the successive approximation resisters 308, 309, and 310 are "1100xx", "1000xx", and "010000", respectively. Since the numbers of bits of the two successive approximation registers 308 and 309 in the second embodiment are reduced by 2 bits, bits 1 and 0 of these successive approximation registers 308 and 309 are represented by "x" in FIG. 10.

The comparators 104, 105, and 106 compare voltages of the outputs 330, 329, and 328 of the D/A converters 313, 312, and 311 with the voltage of the output 133 of the sample and hold circuit 103, respectively. A case where the voltage of the analog input signal 117 is provisionally (25.1/64)Vref will be considered, (25.1/64)Vref is higher than (1/4)Vref and lower than (2/4)Vref. Accordingly, since the outputs 121 and 122 of the comparators 104 and 105 become "0" and the output 123 of the comparator 106 becomes "1", the output 324 of the encoder 307 becomes "01".

In FIG. 11, the first comparison period corresponds to the comparison period T2. Referring to the comparison period T2 in FIG. 11, since the comparison voltage range is from Vref to 0 and the voltage of the analog input signal 117 is higher than (1/4)Vref and lower than (2/4)Vref, the output 324 of the encoder 307 is "01".

In the second comparison period (period T3), the value "01" of the output 324 of the encoder 307 in the first comparison period (period T2) is set to the bits 5 and 4 of the successive approximation resisters 308, 309, and 310. In addition, values "11", "10", and "01" are set to bits 3 and 2 of the successive approximation resisters 308, 309, and 310 in the similar manner to the first comparison period (period T2). Specifically, the values 325, 326, and 327 of the successive approximation resisters 308, 309, and 310 are "0111xx", "0110xx", and "0101xx", respectively. The outputs 330, 329, and 328 of the D/A converters 313, 312, and 311 are (7/16) Vref, (6/16)Vref, and (5/16)Vref, respectively.

The comparators 104, 105, and 106 compare these voltages with the voltage of the output 133 of the sample and hold circuit 103, respectively. That is, the search voltage range, "higher than (1/4)Vref and lower than (2/4)Vref", obtained in the first comparison period (period T2) is searched in more detail. Since the voltage of the analog input signal 117 is (25.1/64)Vref, the voltage is higher than (6/16)Vref and lower than (7/16)Vref. Accordingly, since the output 121 of the comparator 104 is "0", the outputs 122 and 123 of the comparators 105 and 106 are "1", and as the result of this, the output 324 of the encoder 307 is "10". The above-mentioned operation is the same as that of the successive approximation type A/D converter 101 of FIG. 3.

In FIG. 11, the second comparison period corresponds to the comparison period T3. Referring to the comparison period T3 in FIG. 11, since the comparison voltage range is from (8/16)Vref to (4/16)Vref and the voltage of the analog input signal 117 is higher than (6/16)Vref and lower than (7/16)Vref, the output 324 of the encoder 307 becomes "10".

In a third comparison period (period T4) or later, a successive approximation operation will be performed by using the successive approximation register 310, a D/A converter 313 with N-bit resolution, and the comparator 106. Since there is a possibility of erroneous determination in previous comparison periods, a converting operation is performed by adding a redundant range to the search voltage range. In order to determine whether the erroneous determination has occurred or not, are held the outputs 121, 122, and 123 of the comparators 104, 105, 106 in the last of the parallel comparison that is the second comparison period (period T3). Accordingly, the timing control circuit 302 sets the latch signal 340 to "1". The successive approximation register 310 sets a value "10" of the output 324 of the encoder 307 to bits 3 and 2, and the value 327 of the successive approximation register 310 is "011000". The output 328 of the D/A converter 311 is (6/16) Vref, and the comparator 106 compares this voltage with the voltage of the output 133 of the sample and hold circuit 103. Since the voltage of the analog input signal 117 is (25.1/64) Vref, the output 123 of the comparator 106 is "1".

In FIG. 11, the third comparison period corresponds to the comparison period T4. Referring to the comparison period T4 in FIG. 11, since the comparison voltage range is from (7/16) Vref to (5/16)Vref and the voltage of the analog input signal 117 is higher than (6/16)Vref and lower than (7/16)Vref, the output 123 of the encoder 106 is "1".

In a fourth comparison period (period T5), the timing control circuit 302 sets the latch signal 341 to "1", and accordingly the latch 336 holds a value "1" of the output 123 of the comparator 106 in the third comparison period (period T4). In addition, the timing control circuit 302 sets the control signal 343 to "1" to indicate an addition or subtraction signal. In response to "1" of the control signal 343 indicating the addition or subtraction signal, the logic circuit 338 sets the addition signal 346 of the successive approximation register 310 to "1", since the value of the output 324 of the encoder 307 in the last of the parallel comparison (period T3) is "10". The successive approximation register 310 sets the value obtained by adding "1" to bit 2 of own value, that is, "011100" to the value 327. Meanwhile, when a value of the output 324 of the encoder 307 in the last of the parallel comparison is "00", the logic circuit 338 sets the subtraction signal 347 of the successive approximation register 310 to "1" in response to "1" of the control signal 343 indicating the addition or subtraction signal.

Since the value 327 of the successive approximation register 310 is "011100", the output 328 of the D/A converter 311 is (7/16)Vref. The comparator 106 compares this voltage with the voltage of the output 133 of the sample and hold circuit 103. Since the voltage of the analog input signal 117 is (25.1/64)Vref, the output 123 of the comparator 106 becomes "0".

In FIG. 11, the fourth comparison period corresponds to the comparison period T5. Referring to the comparison period T5 in FIG. 11, since the comparison voltage range is from (8/16)Vref to (6/16)Vref and the voltage of the analog input signal 117 is higher than (6/16)Vref and lower than (7/16)Vref, the output 123 of the encoder 106 becomes "0".

The values of bits 5, 4, 3, and 2 will be checked. The timing control circuit 302 sets the latch signal 342 to "1", and accordingly the latch 337 holds the value "0" of the output 123 of the comparator 106 in the fourth comparison period (period T5). The logic circuit 338 determines final values of the bits 5, 4, 3, and 2 of the successive approximation register 310 on the basis of the output 324 of the encoder 307 in the last of the parallel comparison, the output being held by the latch 335, the output 123 of the comparator 106 in the third comparison period (period T4), the output being held by the latch 336, and the output 123 of the comparator 106 in the fourth comparison period (period T5), the output being held by the latch 337. Since the output 324 of the encoder 307 in the last of the parallel comparison (period T3) is "10", the value held by the latch 336 is "1", and the value held by the latch 337 is "0", the final values of bits 3 and 2 are determined as "10" and the output 351 of the logic circuit 338 is "10". When the timing control circuit 302 sets the selection signal 344 to be "1", accordingly the selector 339 selects the output 351 of the logic circuit 338, and thus the successive approximation register 310 sets the output 351 of the logic circuit 338 to the bits 3 and 2.

Meanwhile, when the value of the output 324 of the encoder 307 in the last of the parallel comparison (period T3) is "10", the output 123 of the comparator 106 in the third comparison period (period 14) is "0", and the output 123 of the comparator 106 in the fourth comparison period (period T5) is "0". Thus, the bits 3 and 2 of the successive approximation register 310 are "01". In addition, when the output 123 of the comparator 106 in the third comparison period (period T4) is "1" and the output 123 of the comparator 106 in the fourth comparison period (period T5) is "1". Thus, the bits 3 and 2 of the register 310 are "11".

Moreover, when the value of the output 324 of the encoder 307 in the last of the parallel comparison (period T3) is "01", operation in the third comparison period (period T4) and the fourth comparison period (period T5) are the same as those described above. However, the output 351 of the logic circuit 338 is different from that described above. Specifically, when the output 123 of the comparator 106 in the third comparison period (period T4) is "0" and the output 123 of the comparator 106 in the fourth comparison period (period T5) is "0", the successive approximation register 310 sets "00" to the bits 3 and 2. In addition, when the output 123 of the comparator 106 in the third comparison period (period T4) is "1" and the output 123 of the comparator 106 in the fourth comparison period (period T5) is "0", the successive approximation register 310 sets "01" to the bits 3 and 2. Moreover, when the output 123 of the comparator 106 in the third comparison period (period T4) is "1" and the output 123 of the comparator 106 in the fourth comparison period (period T5) is "1", the successive approximation register 310 sets "10" to the bits 3 and 2.

The values of the bits 1 and 0 will be determined. The timing control circuit 302 sets the successive approximation register control signal 345 to "1", and after that, the successive approximation register 310 performs a comparison operation one bit at a time. In a fifth comparison period (period T6), the successive approximation register 310 sets the bit 1 to "1". Specifically, the value 327 of the successive approximation register 310 becomes "011010". The output 328 of the D/A converter 311 is (13/32)Vref, the comparator 106 compares this voltage with the voltage of the output 133 of the sample and hold circuit 103. Since the voltage of the analog input signal 117 is (25.1/64)Vref, the output 123 of the comparator 106 becomes "0".

In FIG. 11, the fifth comparison period corresponds to a comparison period T6. Referring to the comparison period T6 in FIG. 11, since the comparison voltage range is from (14/32)Vref to (12/32)Vref, and the voltage of the analog input signal 117 is higher than (12/32)Vref and lower than (13/32) Vref, the output 123 of the encoder 106 becomes "0".

In the sixth comparison period (period T7), the timing control circuit 302 sets the 1-bit selection signal 350 to "1", and the selector 339 selects the output 123 of the comparator 106. The successive approximation register 310 sets the value "0" of the output 123 of the comparator 106 in the fifth comparison period (period T6) to the bit 1, and sets "1" to the bit 0. Specifically, the value 327 of the successive approximation register 310 is "011001". The output 328 of the D/A converter 311 is (25/64)Vref, the comparator 106 compares this voltage with the voltage of the output 133 of the sample and hold circuit 103. Since the voltage of the analog input signal 117 is (25.1/64)Vref, the output 123 of the comparator 106 becomes "1".

In FIG. 11, the sixth comparison period corresponds to a comparison period T7. Referring to the comparison period T7 in FIG. 11, since the comparison voltage range is from (26/64)Vref to (24/64)Vref and the voltage of the analog input signal 117 is higher than (25/64)Vref and lower than (26/64)Vref, the output 123 of the encoder 106 becomes "1".

When the comparison of six times is completed, the successive approximation register 310 sets the value "1" of the output 123 of the comparator 106 in the sixth comparison period (period T7) to the bit 0, and values from the most significant bit (bit 5) to the least significant bit (bit 0) are determined. Specifically, the value of the successive approximation register 310 is "011001". The timing control circuit 302 outputs "1" of the conversion end signal 332, and "011001" is outputted from the buffer 314 as the A/D conversion result 131. Since one A/D conversion operation is completed through comparison of (N/2+3) times in case of the successive approximation type A/D converter 301 with N-bit resolution, the number of times of comparison is greater by 2 than that of the successive approximation type A/D converter 101 of FIG. 3. However, a high speed conversion as fast as that of the successive approximation type A/D converter 101 of FIG. 3 can be realized when the resolution N is high.

Figure 12:
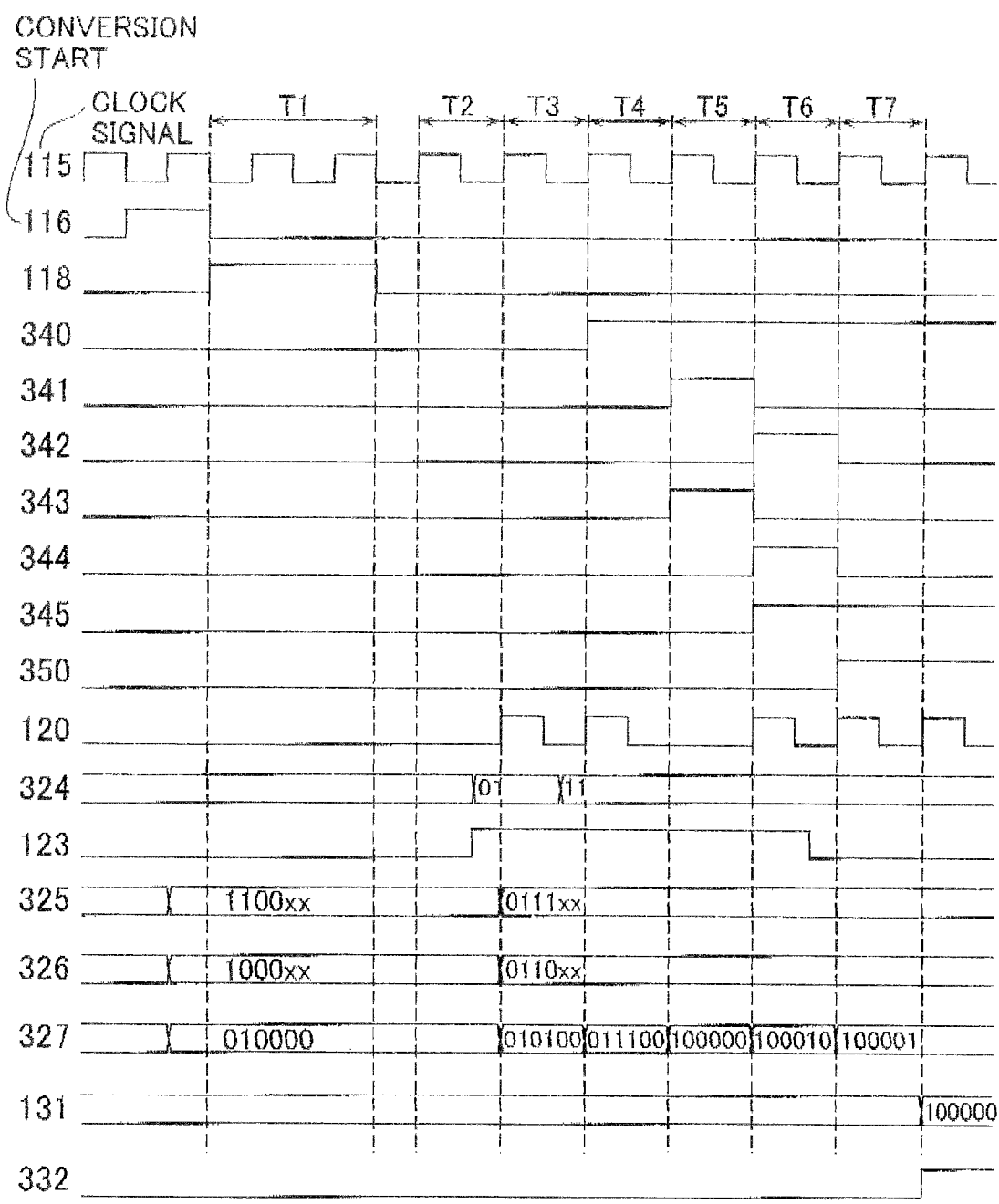
FIG. 12 is a time chart to explain an operation of a case where the successive approximation type A/D converter of FIG. 9 made an erroneous determination in comparison in midstream.
Figure 13:
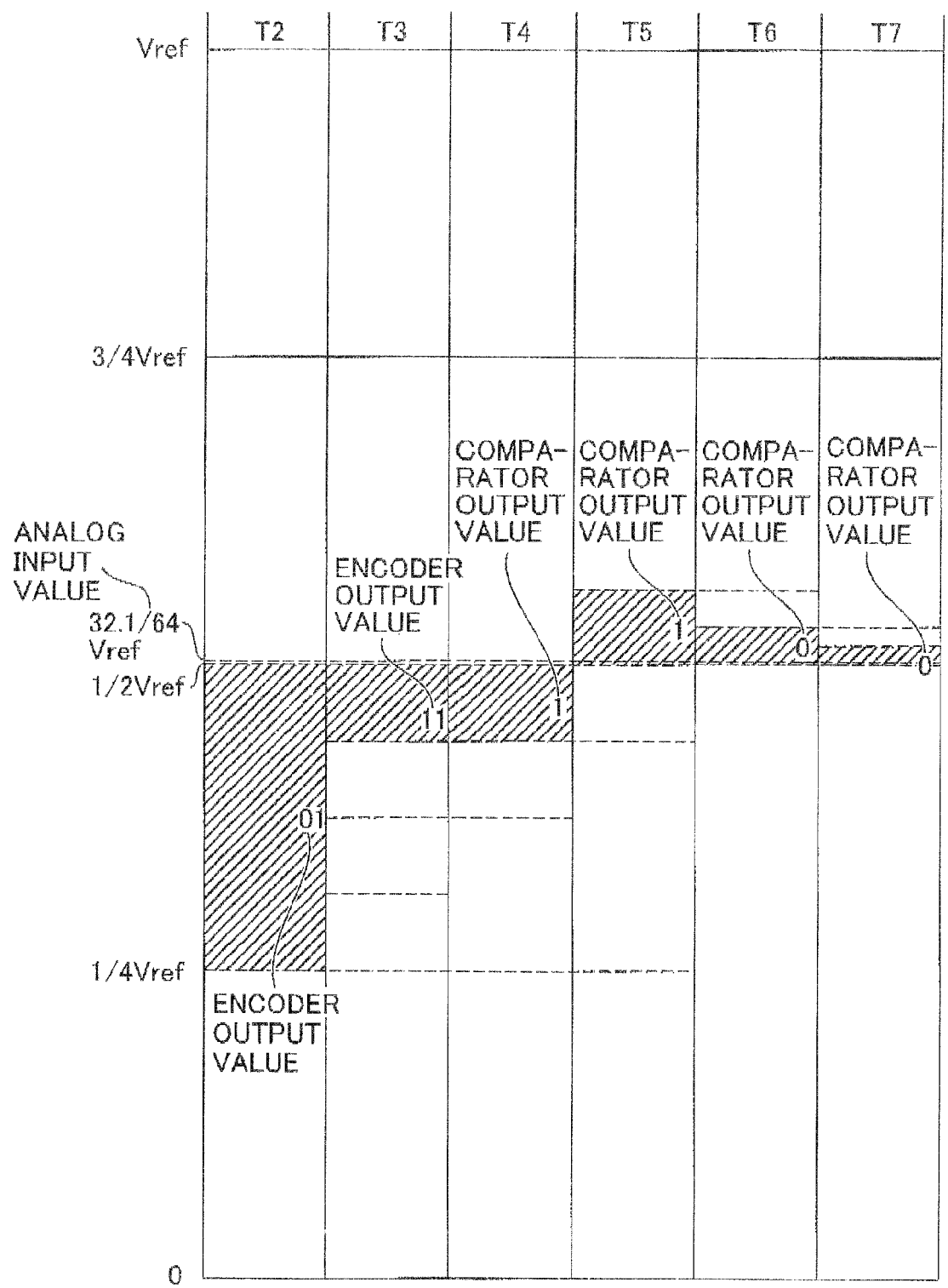
FIG. 13 is an explanation view showing a change of a search voltage range in a case of the operation example of FIG. 12.

FIG. 12 shows an example of an operation when an erroneous determination is made in comparison, and FIG. 13 shows change of the search voltage range in case of the operation example of FIG. 12. Here, a case where the voltage of the analog input signal 117 is (32.1/64)Vref is shown as an example. In FIG. 13, the vertical axis represents an internal comparison voltage range of the successive approximation type A/D converter, and a horizontal axis represents passage of time. A hatching portion represents a selected voltage range in respective comparison periods.

Since an operation before the period T2 is the same as the operation of FIG. 10, an explanation will start from the period T2. Since the voltage of the analog input signal 117 is (32.1/64)Vref and the voltage is higher than (2/4)Vref and lower than (3/4)Vref, the output 324 of the encoder 307 normally has to be "10" in the first comparison period (period T2). However, in case of high resolution and a case of a high conversion speed, for example, the comparator 105 with a small voltage difference for determination sometimes makes erroneous determination, and the output 324 of the encoder 307 is incorrect to be "01" in FIG. 12.

In FIG. 13, the first comparison period corresponds to the comparison period T2. Referring to the comparison period T2 in FIG. 13, since the comparison voltage range is front Vref to 0 and erroneous determination that determined the voltage of the analog input signal 117 to be higher than (1/4)Vref and lower than (2/4)Vref has been made, the output 324 of the encoder 307 is "01".

In a second comparison period (period T3), the value "01" of the output 324 of the encoder 307 In the first comparison period (period T2) is set to the bits 5 and 4 of the successive approximation resisters 308, 309, and 310. In addition, values "11", "10", and "01" are set to bits 3 and 2 of the successive approximation resisters 308, 309, and 310 in the similar manner to the first comparison period (period T2). Specifically, the values 325, 326, and 327 of the successive approximation resisters 308, 309, and 310 are set as "011100", "011000", and "010100", respectively. The voltages of the outputs 330, 329, and 328 of the D/A converters 313, 312, and 311 are (7/16)Vref, (6/16)Vref, and (5/16)Vref, respectively, and the comparators 104, 105, and 106 compare these voltages with the voltage of the output 133 of the sample and hold circuit 103, respectively. That is, the voltage range, "higher than (1/4)Vref and lower than (2/4) Vref", obtained in the first comparison period (period T2) is searched in more detail.

Since the voltage of the analog input signal 117 is (32.1/64)Vref, the voltage is determined to be higher than (7/16)Vref. That is, all of the outputs 121, 122, and 123 of the comparators 104, 105, and 106 are "1", and the output 324 of the encoder 307 is "11".

In FIG. 13, the second comparison period corresponds to the comparison period T3. Referring to the comparison period T3 in FIG. 13, the comparison voltage range is normally from (12/16)Vref to (8/16)Vref. However, the range is from (8/16)Vref to 4/16)Vref because the comparator 105 has made erroneous determination in the first comparison period (period T2). In addition, since the voltage of the analog input signal 117 is higher than (7/16)Vref, the output 324 of the encoder 307 is "11".

In a third comparison period (period T4) or later, a successive approximation operation will be performed by using the successive approximation register 310 with N-bit resolution, a D/A converter 311 with N-bit resolution, and the comparator 106. Since there is a possibility of erroneous determination in previous comparison periods, the redundant comparison operation is performed by adding a redundant range to the search voltage range. The timing control circuit 302 sets the latch signal 340 to "1", and holds in the latch 335, values of the outputs 121, 122, and 123 of the comparators 104, 105, and 106 in the last of the parallel comparison, that is, the second comparison period (period T3). The successive approximation register 310 sets a value "11" of the output 324 of the encoder 307 to bits 3 and 2, and the value 327 of the successive approximation register 310 is set to "011100". The output 328 of the D/A converter 311 becomes (7/16)Vref, and the comparator 106 compares this voltage with the voltage of the output 133 of the sample and hold circuit 103. Since the voltage of the analog input signal 117 is (32.1/64)Vref, the output 123 of the comparator 106 is set to "1".

In FIG. 13, the third comparison period corresponds to the comparison period T4. Referring to the comparison period T4 in FIG. 13, since the comparison voltage range is from (8/16)Vref to (6/16)Vref and the voltage of the analog input signal 117 is higher than (7/16)Vref, the output 123 of the encoder 106 is set to "1".

In a fourth comparison period (period T5), the timing control circuit 302 sets the latch signal 341 to "1", sets the selection signal 344 indicating an addition signal to "1", and holds the value "1" of the output 123 of the comparator 106 in the third comparison period (period T4) in the latch 336. In addition, the timing control circuit 302 sets the control signal 343 indicating an addition or subtraction signal to "1". In response to the control signal 343 indicating an addition or subtraction signal, the logic circuit 338 sets the addition signal 346 of the successive approximation register 310 to "1" since a value of the output 324 of the encoder 307 in the last of the parallel comparison (period T3) is "11". The successive approximation register 310 sets the value 327 to a value obtained by adding "1" to bit 2, that is, "100000". The output 328 of the D/A converter 311 is (1/2)Vref, the comparator 106 compares this voltage with the voltage of the output 133 of the sample and hold circuit 103. Since the voltage of the analog input signal 117 is (32.1/64)Vref, the output 123 of the comparator 106 is set to "1".

In FIG. 13, the fourth comparison period corresponds to the comparison period T5. Referring to the comparison period T5 in FIG. 13, since the comparison voltage range is from (9/16)Vref to (7/16)Vref and the voltage of the analog input signal 117 is higher than (8/16)Vref, the output 123 of the encoder 106 is set to "1".

The values of bits 5, 4, 3, and 2 will be verified. The timing control circuit 302 sets the latch signal 342 to "1", and holds the value "1" of the output 123 of the comparator 106 in the fourth comparison period (period T5) in the latch 337. The logic circuit 338 determines the final values of bits 5, 4, 3, and 2 of the successive approximation register 310 on the basis of the output 324 of the encoder 307 in the last of the parallel comparison held by the latch 335, the output 123 of the comparator 106 in the third comparison period (period T4) held by the latch 336, and the output 123 of the comparator 106 in the fourth comparison period (period T5) held by the latch 337. The final values of bits 3 and 2 are determined as "00", a carry signal is set to "1", the carry is added to bit 4, and correction of bits 5, 4, 3, and 2 is performed since the output of the encoder 307 in the last of the parallel comparison (period T3) is "11", the value held by the latch 336 is "1", and the value held by the latch 337 is "1". The timing control circuit 302 sets the successive approximation register control signal 345 to "1", and thus the successive approximation register 310 performs the operation by 1 bit at a time.

In a fifth comparison period (period T6), the successive approximation register 310 sets bit 1 to "1". Specifically, the value 327 of the successive approximation register 310 is set to "100010". The output 328 of the D/A converter 311 is set to (17/32)Vref, and the comparator 106 compares this voltage with the voltage of the output 133 of the sample and hold circuit 103. Since the voltage of the analog input signal 117 is (32.1/64)Vref, the output 123 of the comparator 106 is set to "1".

In FIG. 13, the fifth comparison period corresponds to the comparison period T6. Referring to the comparison period T6 in FIG. 13, since the comparison voltage range is from (18/32)Vref to (16/32)Vref and the voltage of the analog input signal 117 is lower than (17/32)Vref, the output 123 of the encoder 106 is set to "0".

In the sixth comparison period (period T7), the timing control circuit 302 sets the 1-bit selection signal 350 to "1", and the selector 339 selects a value of the output 123 of the comparator 106. The successive approximation register 310 sets the value "0" of the output 123 of the comparator 106 in the fifth comparison period (period T6) to the bit 1, and sets "1" to the bit 0. Specifically, the value 327 of the successive approximation register 310 is set to "100001". The output 328 of the D/A converter 311 is set to (33/64)Vref, and the comparator 106 compares this voltage with the voltage of the output 133 of the sample and hold circuit 103. Since the voltage of the analog input signal 117 is (32.1/64)Vref, the output 123 of the comparator 106 is set to "0".

In FIG. 13, the sixth comparison period corresponds to the comparison period T7. Referring to the comparison period T7 in FIG. 13, since the comparison voltage range is from (34/64)Vref to (32/64) Vref and the voltage of the analog input signal 117 is lower than (33/64)Vref, the output 123 of the encoder 106 is set to "0".

When the comparison of six times is completed, the value "0" of the output 324 of the encoder 307 in the sixth comparison period (period T7) is set to the bit 0 of the successive approximation register 310, and values from the most significant bit (bit 5) to the least significant bit (bit 0) are determined. The timing control circuit 302 outputs "1" of the conversion end signal 332, and the A/D conversion result 131 is outputted from the buffer 314. Since one A/D conversion operation is completed by (N/2+3) times comparison in case of the successive approximation type A/D converter with N-bit resolution, the number of times of the comparison is greater by 2 than that of the successive approximation type A/D converter of FIG. 3. However, a high speed conversion as fast as that of the successive approximation type A/D converter of FIG. 3 can be realized when the resolution N is high. In addition, even when an erroneous determination was made in comparison in midstream, the search voltage range can be reset by adding a redundant search voltage range, thereby a high-speed conversion can be realized without reducing conversion accuracy.

Figure 14A:
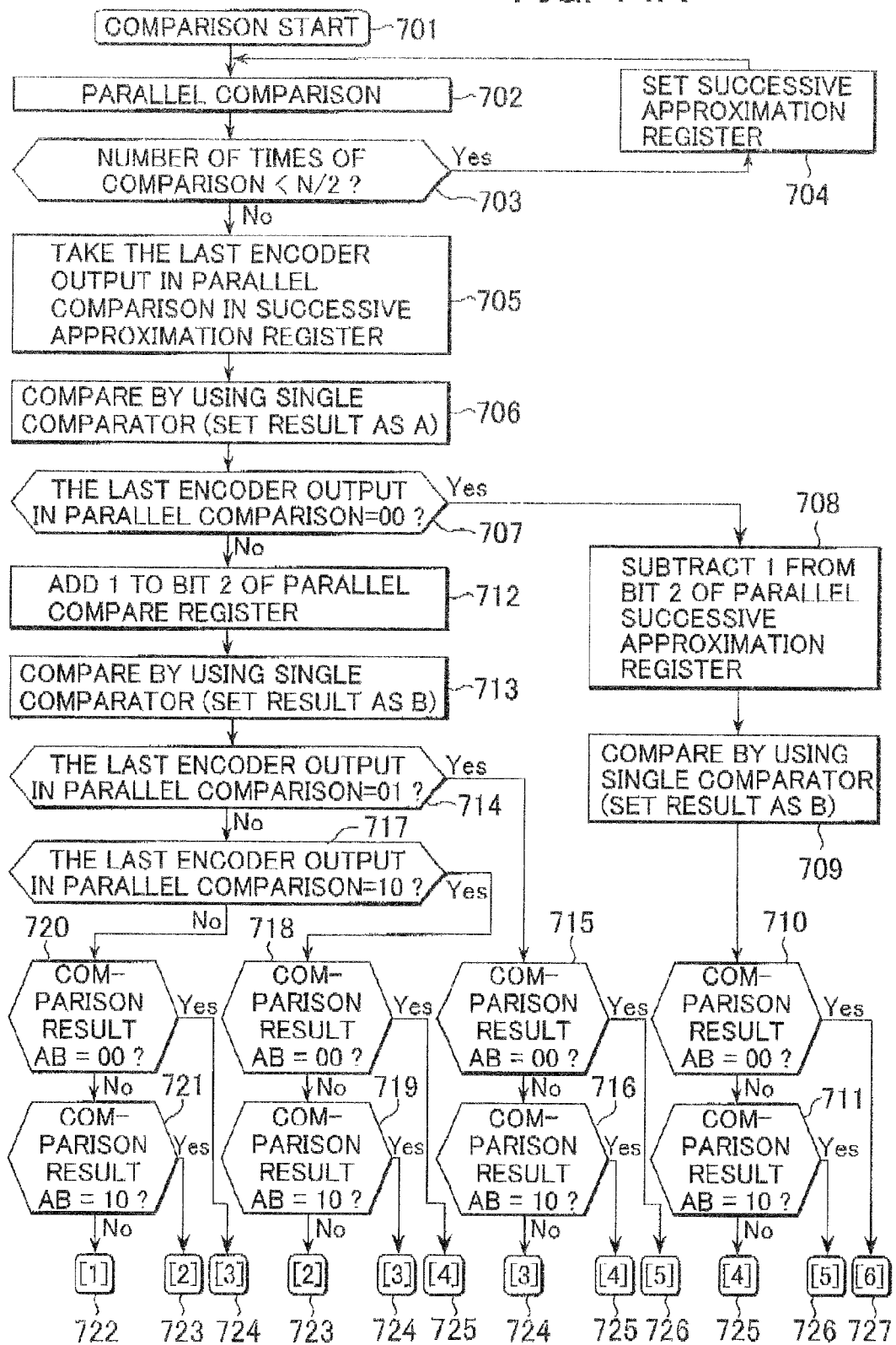

FIGS. 14A and 14B show a flowchart to show the converting operation according to the second embodiment. When the converting operation starts at a step 701 in FIGS. 14A and 14B, 2-bit comparison is performed in parallel at a step 702 by using three D/A converters and three comparators. At a step 703, it is determined whether or not the parallel comparison has been completed the predetermined number of times. The predetermined number of times can be obtained by the calculation equation of (N−2)/2 in case of the A/D converter with N-bit resolution. 2 of the subtraction is the number of bits for reduced resolution, and 2 of the division is the number of stages in parallel comparison.

When the number of stages in the parallel comparison is less than the predetermined number of times in the determination at the step 703, a comparison result is set to the successive approximation register at a step 704 and a voltage used in next comparison is determined. That is, a binary search by 2 bits is performed by repeating steps 702, 703, and 704 the predetermined number of times. When it is determined at the step 703 that the parallel comparison has been completed the predetermined number of times, the process flow proceeds to a step 705 or later, and the comparison is performed by using one D/A converter and one comparator. In addition, since there is a possibility of erroneous determination in previous comparison periods, the redundant comparison operation is performed.

At the step 705, an encoder output in the last of the parallel comparison is set to the successive approximation register. At a step 706, a first redundant comparison operation is performed, and a comparison result at this time is held. At a step 707, the search voltage range for a second redundant comparison operation is switched to be reset to a higher voltage side, to be reset to a lower voltage side, or not to be reset. The switching is performed on the basis of the encoder output in the last of the parallel comparison.

When the encoder output in the last of the parallel comparison is "00", the process flow proceeds from the step 707 to a step 708 and the search voltage range is reset to the lower side by subtracting "1" from the bit 2 of the successive approximation register. Then, the second redundant comparison at a step 709 is performed. On the other hand, when the encoder output in the last of the parallel comparison is other than "00", the process flow proceeds from the step 707 to a step 712 and the search voltage range is reset to the higher side by adding "1" to the bit 2 of the successive approximation register. Then, the second redundant comparison at a step 713 is performed.

When the second redundant comparison at the step 709 or 713 is completed, the final values of bits 5, 4, 3, and 2 of the successive approximation register are determined on the basis of the encoder output in the last of the parallel comparison, a result of the first redundant comparison, and a result of the second redundant comparison.

When the encoder output in the last of the parallel comparison is "00" and the results of the first (step 706) and the second (step 713) redundant comparisons are "00", the voltage range selected by the encoder output in the last of the parallel comparison is set to a next lower voltage range. At steps 710, 727, and 733, "1" is subtracted from the bit 4 of the successive approximation register, and the bits 3 and 2 of the successive approximation register are set to "11". When the encoder output in the last of the parallel comparison is "00" and the results of the first and the second redundant comparisons are "10", the voltage range selected by the encoder output in the last of the parallel comparison is regarded as a correct range. At steps 711, 726, and 732, the bits 3 and 2 of the successive approximation register are set to "00". When the encoder output in the last of the parallel comparison is "00" and the results of the first and the second redundant comparisons are "11", the voltage range selected by the encoder output in the last of the parallel comparison is set to a next upper voltage range. At steps 711, 725, and 731, the bits 3 and 2 of the successive approximation register are set to "01".

When the encoder output in the last of the parallel comparison is "01" and the results of the first and the second redundant comparisons are "00", the voltage range selected by the encoder output in the last of the parallel comparison is set to a next lower voltage range. At steps 715, 726, and 732, the bits 3 and 2 of the successive approximation register are set to "00". When the encoder output in the last of the parallel comparison is "01" and the results of the first and the second redundant comparisons are "10", the voltage range selected by the encoder output in the last of the parallel comparison is regarded as a correct range. At steps 716, 725, and 731, the bits 3 and 2 of the successive approximation register are set to "01". When the encoder output in the last of the parallel comparison is "01" and the results of the first and the second redundant comparisons are "11", the voltage range selected by the encoder output in the last of the parallel comparison is set to a next upper voltage range. At steps 716, 724, and 730, the bits 3 and 2 of the successive approximation register are set to "10".

When the encoder output in the last of the parallel comparison is "10" and the results of the first and the second redundant comparisons are "00", the voltage range selected by the encoder output in the last of the parallel comparison is set to a next lower voltage range. At steps 718, 725, and 731, the bits 3 and 2 of the successive approximation register are set to "01". When the encoder output in the last of the parallel comparison is "10" and the results of the first and the second redundant comparisons are "10", the voltage range selected by the encoder output in the last of the parallel comparison is regarded as a correct range. At the steps 719, 724, and 730, the bits 3 and 2 of the successive approximation register are set to "10". When the encoder output in the last of the parallel comparison is "10" and the results of the first and the second redundant comparisons are "11", the voltage range selected by the encoder output in the last of the parallel comparison is set to a next upper voltage range. At the steps 719, 723, and 729, the bits 3 and 2 of the successive approximation register are set to "11".

When the encoder output in the last of the parallel comparison is "11" and the results of the first and the second redundant comparisons are "00", the voltage range selected by the encoder output in the last of the parallel comparison is set to a next lower voltage range. At the steps 720, 724, and 730, the bits 3 and 2 of the successive approximation register are set to "10". When the encoder output in the last of the parallel comparison is "11" and the results of the first and the second redundant comparisons are "10", the voltage range selected by the encoder output in the last of the parallel comparison is regarded as a correct range. At the steps 721, 723, and 729, the bits 3 and 2 of the successive approximation register are set to "11". When the encoder output in the last of the parallel comparison is "11" and the results of the first and the second redundant comparisons are "11", the voltage range selected by the encoder output in the last of the parallel comparison is set to a next upper voltage range. At the steps 721, 722, and 728, "1" is added to the bit 4 of the successive approximation register, and the bits 3 and 2 of the successive approximation register are set to "00".

After the determination of the bits 5, 4, 3, and 2 of the successive approximation register, the process flow proceeds to a step 734. At the step 734, a successive approximation for determining the bits 1 and 0 of the successive approximation register is performed by using one D/A converter and one comparator, and the comparison operation is completed at a step 735.

The successive approximation type A/D converter of FIG. 3 uses three D/A converters with N-bit resolution. However, the successive approximation type A/D converter of FIG. 9 uses one D/A converter with N-bit resolution and two D/A converters with (N−2)-bit resolution. According to the second embodiment, as shown at the steps 702 to 704 in FIGS. 14A and 14B, a parallel comparison (high-speed comparison) is performed by a D/A converter which can output a plurality of comparison voltages and a plurality of comparators. After that, as shown at the steps 705 to 708 and the step 712, the redundant search voltage range is reset based on a result of the parallel comparison, and redundant comparisons shown at the steps 709 and 713 are performed. Since the method for obtaining the final conversion result after resetting the search voltage range by this redundant comparison is employed, a correct conversion result can be obtained even when erroneous determination has been made in the parallel comparison. Accordingly, an accuracy of the A/D converter can be improved.

When the D/A converter includes a resistance string, the D/A converter with N-bit resolution requires $2^N$ resistances. On the other hand, since the D(N−2)-bit/A converter only requires $2^{(N-2)}$ resistances, the number of resistances can be reduced to one-forth in the successive approximation type A/D converter of FIG. 9. Specifically, in the second embodiment, an effect of suppressing a layout size of the successive approximation type A/D converter is obtained. Since the number of resistances or capacitances to be used can be reduced when the D/A converter includes a capacitance array, a case where upper M bits include a capacitance array and lower (N-M) bits include a resistance string, and a case where the upper M bits include a resistance string and the lower (N-M) bits include the capacitance array, a layout size of the successive approximation type A/D converter can be suppressed to be small.

In addition, the successive approximation type A/D converter of FIG. 9 is configured to perform the conversion through (N/2+3)-time comparisons by using one N-bit D/A converter and two (N−2)-bit D/A converters, however, the combination of the number of bits and the number of comparisons may be other combinations.

Figure 15:
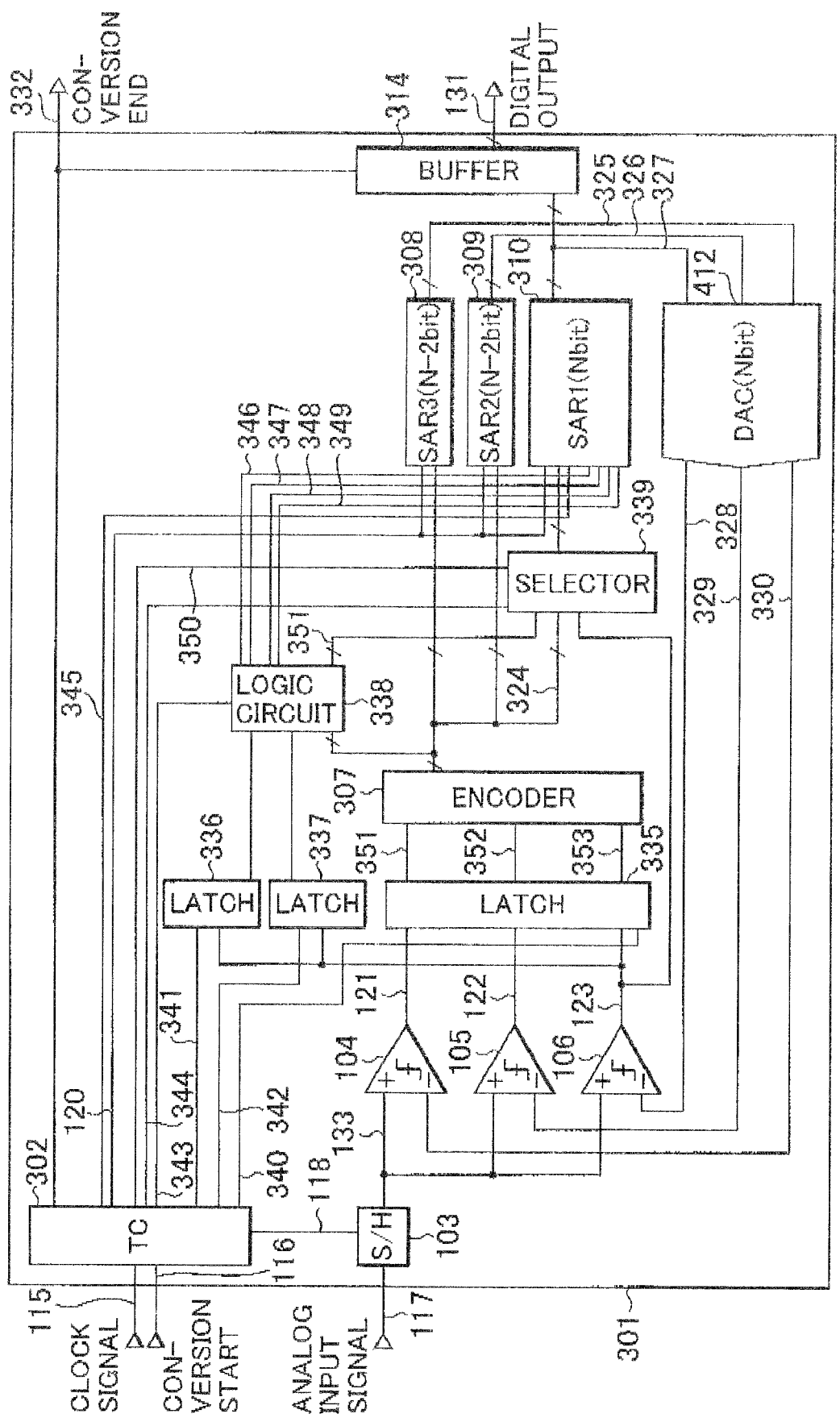
FIG. 15 is a view showing a circuit configuration of a successive approximation type A/D converter obtained by modifying the successive approximation type A/D converter of FIG. 9.

FIG. 15 shows a circuit configuration of a successive approximation type A/D converter 301 obtained by modifying the successive approximation type A/D converter of FIG. 9. The successive approximation type A/D converter 301 shown in FIG. 15 operates in the similar manner to the successive approximation type A/D converter of FIG. 9. However, a part of the circuit configuration is different from that of FIG. 9, and one D/A converter 412 is used in place of the three independent D/A converters 311, 312, and 313.

Figure 16:
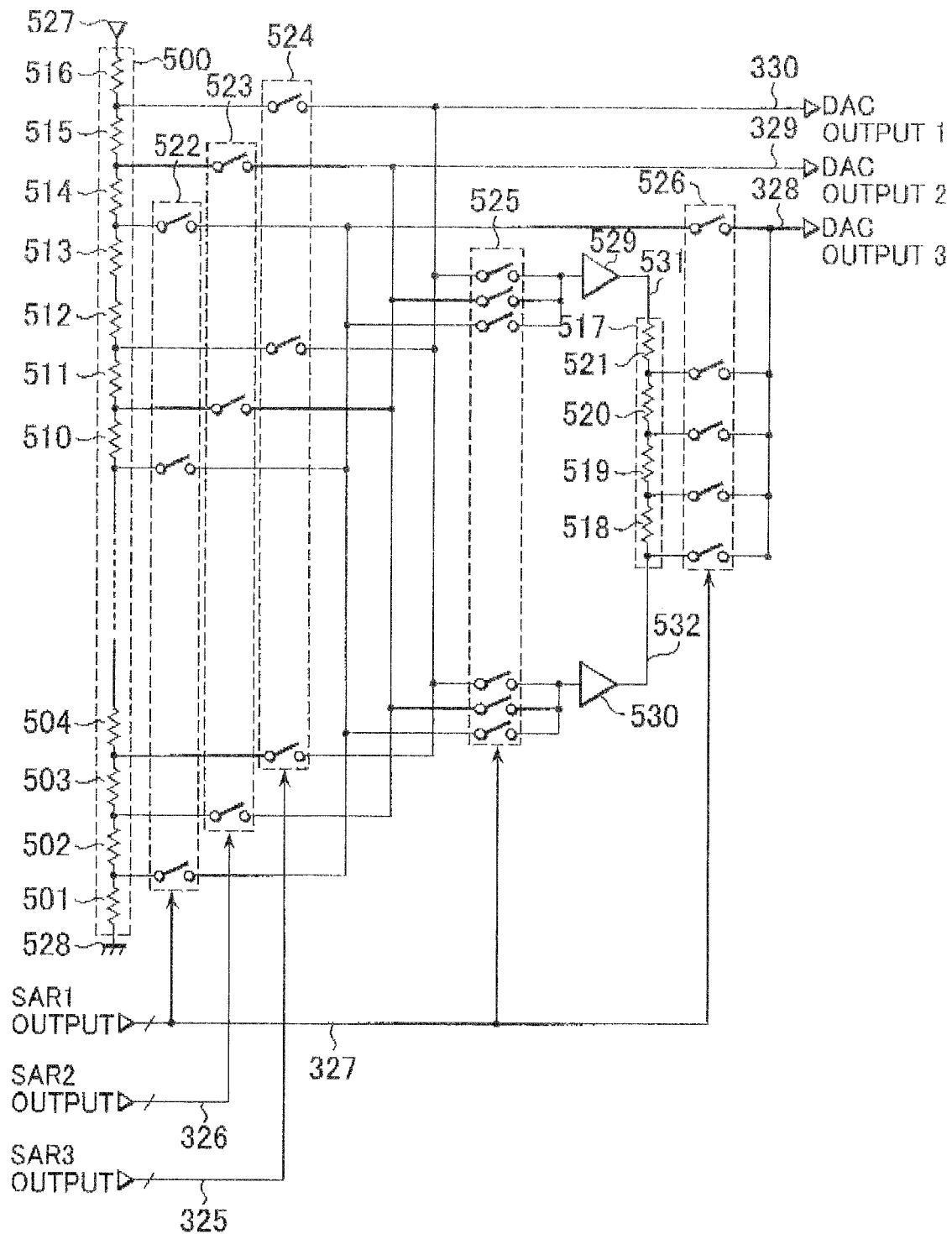
FIG. 16 is a view showing an example of a circuit configuration of a case of using a resistance string type D/A converter as a D/A converter 412 of FIG. 15.

FIG. 16 shows a first example of a circuit configuration of a D/A converter 412. In FIG. 16, a resistance string type D/A converter is used. In FIG. 16, a 4-bit resistance string 500 includes 16 resistances, i.e. resistances 501 to 516, and is connected to three switch groups 522, 523, and 524. A reference voltage Vref is applied to a node 527 and a node 528 has a ground voltage. The switch group 522 is controlled so that any one of switches can be turned on based on the value 327 of the successive approximation resistor 310. By the switch turned on, any one of 16 voltages divided by using 4-bit representation can be set as the output 328 of the D/A converter 412. The switch group 523 is controlled so that any one of switches can be turned on based on the value 326 of the successive approximation resistor 309. By the switch turned on, any one of 16 voltages divided by using 4-bit representation can be set as the output 329 of the D/A converter 412. The switch group 524 is controlled so that any one of switches can be turned on based on the value 325 of the successive approximation resistor 308. By the switch turned on, any one of 16 voltages divided by using 4-bit representation can be set as the output 330 of the D/A converter 412.

A switch group 525 is connected to the outputs 328, 329, and 330 of the D/A converter 412. The switch group 525 is controlled on the basis of the value 327 of the successive approximation register 310, and two switches are turned on. Specifically, the switch group 525 selects two voltages from among the three voltages selected by the switch groups 522, 523, and 524, and supplies the two voltages to buffer amplifiers 529 and 530.

A resistance string 517 includes 4 resistances 518 to 521, and has 2-bit resolution. Voltages obtained through division in accordance with 4-bit resolution are applied to nodes 531 and 532 by the switch groups 522, 523, and 524, and the resistance string 517 further divides them in 2-bit resolution. Accordingly, voltages divided in 6-bit resolution can be obtained. A switch group 526 is connected to the resistance string 517. The switch group 526 is controlled on the basis of the value 327 of the successive approximation register 310, and one switch is turned on. By the switch turned on, voltages divided in 6-bit resolution can be set to be the output 328 of the D/A converter 412.

In case of using three independent D/A converters of 4 bits, 4 bits, and 6 bits, 96(=16+16 +64) resistances are required. On the other hand, when three 4-bit D/A converters are configured by using a single resistance string 500 and configured to further divide the outputs by the 2-bit resistance string 517 as shown in FIG. 16, the number of the resistances is only 20(=16+4). Accordingly, the D/A converter of FIG. 16 can substantially reduce the number of resistances to be used, and the layout size of the successive approximation type A/D converter can be suppressed to be small.

Figure 17:
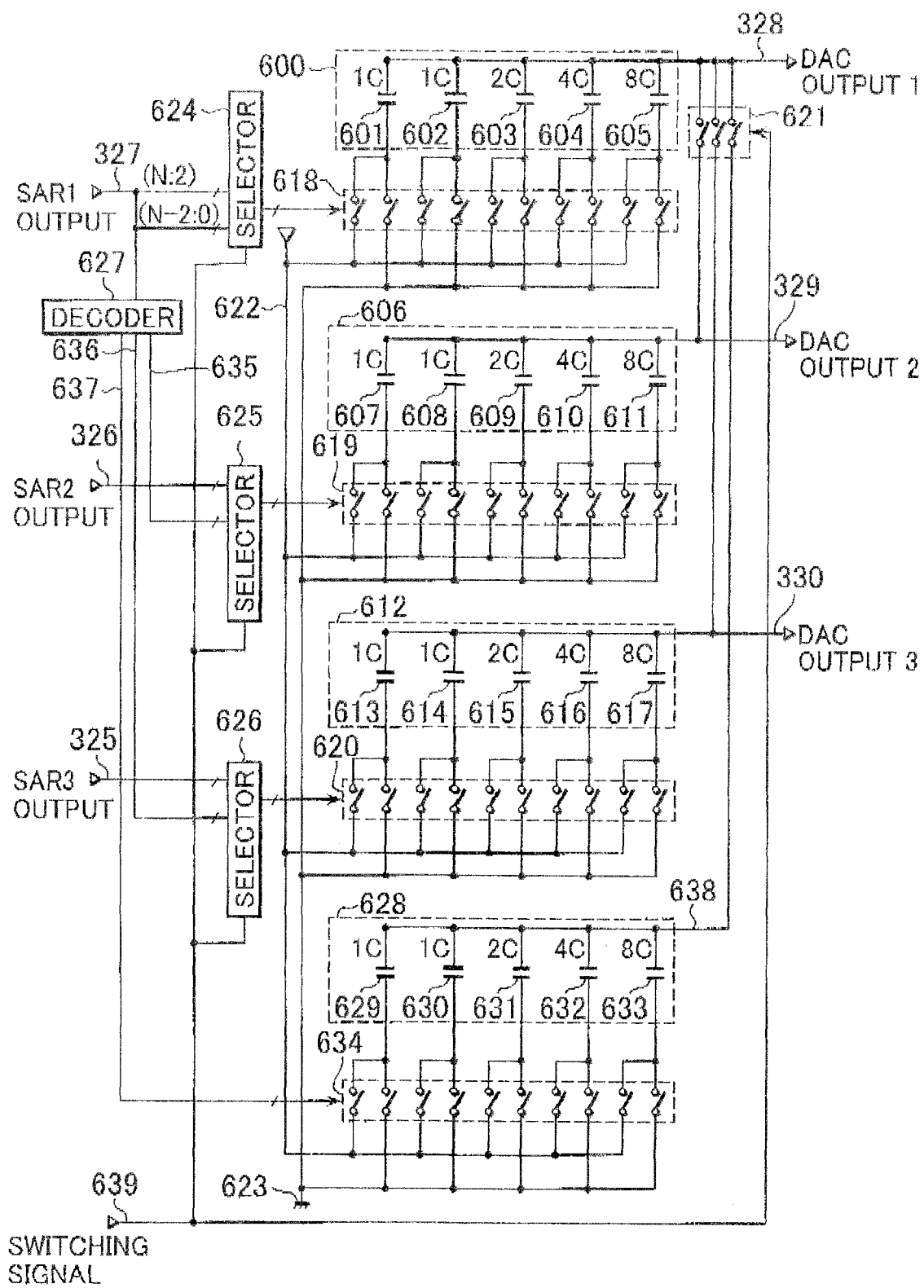
FIG. 17 is a view showing an example of a circuit configuration of a case of using a capacitance array type D/A converter as the D/A converter 412 of FIG. 15.

FIG. 17 shows a second example of a circuit configuration of a D/A converter 412. In FIG. 17, a capacitance array type D/A converter is used. In FIG. 17, a 4-bit capacitance array 600 includes binary-weighted 5 capacitances, namely, capacitances 601 and 602 having a capacitance value of a unit capacitance, a capacitance 603 having a capacitance value twice as much as the unit capacitance, a capacitance 604 having a capacitance value four times as much as the unit capacitance, and a capacitance 604 having a capacitance value eight times as much as the unit capacitance. A switch group 618 is connected to the capacitance array 600, and this switch group 618 is controlled by a selector 624 for inputting the value 327 of the successive approximation register 310. The switch group 618 connects one of electrodes of capacitances 601, 602, 603, 604, and 605 to a node 622 to which a reference voltage Vref is applied or to a node 623 of the ground voltage. In this manner, the capacitance voltage division is performed in 4-bit resolution, and an obtained voltage can be set as the output 328 of the D/A converter 412.

A 4-bit capacitance array 606 includes binary-weighted 5 capacitances, namely, capacitances 607 and 608 having a capacitance value of a unit capacitance, a capacitance 609 having a capacitance value twice as much as the unit capacitance, a capacitance 610 having a capacitance value four times as much as the unit capacitance, and a capacitance 611 having a capacitance value eight times as much as the unit capacitance. A switch group 619 is connected to the capacitance array 606, and this switch group 619 is controlled by a selector 625 for inputting the value 326 of the successive approximation register 309 and a decode value 635 of a decoder 627. The switch group 619 connects one of electrodes of capacitances 607, 608, 609, 610, and 611 to a node 622 to which a reference voltage Vref is applied or to a node 623 of the ground voltage. In this manner, the capacitance voltage division is performed in 4-bit resolution, and the obtained voltage can be set as the output 329 of the D/A converter 412.

A 4-bit capacitance array 612 includes binary-weighted 5 capacitances, namely, capacitances 613 and 614 having a capacitance value of a unit capacitance, a capacitance 615 having a capacitance value twice as much as the unit capacitance, a capacitance 616 having a capacitance value four times as much as the unit capacitance, and a capacitance 617 having a capacitance value eight times as much as the unit capacitance. A switch group 620 is connected to the capacitance array 612, and this switch group 620 is controlled by a selector 626 for inputting the value 325 of the successive approximation register 308 and a decode value 636 of a decoder 627. The switch group 620 connects one of electrodes of capacitances 613, 614, 615, 616, and 617 to a node 622 to which a reference voltage Vref is applied or to a node 623 of the ground voltage. In this manner, the capacitance voltage division is performed in 4-bit resolution, and an obtained voltage can be set as the output 330 of the D/A converter 412.

A 4-bit capacitance array 628 includes binary-weighted 5 capacitances, namely, capacitances 629 and 630 having a capacitance value of a unit capacitance, a capacitance 631 having a capacitance value twice as much as the unit capacitance, a capacitance 632 having a capacitance value four times as much as the unit capacitance, and a capacitance 633 having a capacitance value eight times as much as the unit capacitance. A switch group 634 is connected to the capacitance array 628. The switch group 634 is controlled on the basis of a decode value 637 of the decoder 627, and connects one of electrodes of capacitances 629, 630, 631, 632, and 633 to a node 622 to which a reference voltage Vref is applied or to a node 623 of the ground voltage. In this manner, the capacitance voltage division is performed in 4-bit resolution, and an obtained voltage can be set as a D/A output 638.

When a switch signal 639 is "0", selectors 624, 625, and 626 select values 327, 326, and 325 of the successive approximation registers 310, 309, and 308, and the three 4-bit capacitance arrays 600, 606, and 612 operate as three 4-bit D/A converters. On the other hand, when a switch signal 639 is "1", the selectors 624, 625, and 626 switch their selections and select a value based on the value 327 of the successive approximation register 310. In addition, the switch group 612 is short-circuited. By "1" of the switch signal 639, the value 327 of the successive approximation register 310 is supplied to the switch groups 618, 619, and 620 of the three 4-bit capacitance arrays 600, 606, 612 and to the switch group 634 of another 4-bit capacitance array 628. Moreover, the outputs 328, 329, and 330 of the D/A converter 412 and another D/A output 638 are short-circuited. In this manner, voltages divided in 6-bit resolution can be set as the output 328 of the D/A converter 412, they can operate as one 6-bit capacitance array type D/A converter.

In the case of using three independent D/A converters of 4 bits, 4 bits, and 6 bits, 96(=16+16+64) resistances are required. On the other hand, when one 6-bit capacitance array type D/A converter is configured by combining outputs of 4 capacitance array type 4-bit D/A converter as shown in FIG. 17, the number of the capacitances is only 64. Accordingly, the D/A converter of FIG. 17 can substantially reduce the number of capacitances to be used, and the layout size of the successive approximation type A/D converter can be suppressed to be small.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A successive approximation-type analog-to-digital converter, comprising:
   a sampling and holding circuit configured to sample and hold an analog input voltage;
   a digital-to-analog converter section configured to receive current digital data corresponding to a current search voltage range, and to output a plurality of comparison voltages based on the current digital data;
   a comparator section configured to perform parallel comparison in which the held analog input voltage is compared with each of the plurality of comparison voltages;
   a successive approximation register section configured to determine digital data for a next search voltage range within the current search voltage range based on a result of the parallel comparison using the current search voltage range, and to output the digital data as the current digital data to said digital-to-analog converter section such that the parallel comparison is successively performed; and
   a timing control circuit configured to generate a switching signal from the parallel comparison to a redundant comparison such that the redundant comparison is performed.

2. The successive approximation-type analog-to-digital converter according to claim 1, wherein said successive approximation register section:
   outputs as the current digital data, the digital data for a target search voltage range above the current search voltage range is set, when a result of the parallel comparison immediately before the redundant comparison indicates all "1" values, and
   outputs as the current digital data, the digital data for a target search voltage range below the current search voltage range is set, when the result of the parallel comparison immediately before the redundant comparison indicates all "0" values.

3. The successive approximation-type analog-to-digital converter according to claim 2, wherein said successive approximation register section determines the digital data for the target search voltage range based on the result of the parallel comparison immediately before the redundant comparison, and outputs the digital data as a redundant comparison digital data to said digital-to-analog converter section,
   said digital-to-analog converter section outputs at least one redundant comparison voltage based on the redundant comparison digital data, and
   said comparator section performs the redundant comparison in which the held analog input voltage and the redundant comparison voltage are compared.

4. The successive approximation-type analog-to-digital converter according to claim 3, wherein said digital-to-analog converter section outputs a first comparison voltage as one of the plurality of comparison voltages, and a second comparison voltage as another of the plurality of comparison voltages based on the redundant comparison digital data, the first comparison voltage corresponding to resolution reduced from an original resolution by a predetermined number of bits, the second comparison voltage corresponding to the original resolution,
   said successive approximation register section outputs the redundant comparison digital data for the redundant comparison voltage to said digital-to-analog converter section at a timing after the last parallel comparison,
   said digital-to-analog converter section outputs the redundant comparison voltage as the second comparison voltage based on the redundant comparison digital data, and
   said comparator section performs the redundant comparison in which the analog input voltage and the redundant comparison voltage as the second comparison voltage are compared.

5. The successive approximation-type analog-to-digital converter according to claim 4, wherein said digital-to-analog converter section comprises:
   a first resistance string which has the resolution reduced from the original resolution for the predetermined number of bits; and
   a second resistance string which has the original resolution,
   the first comparison voltage is outputted by using said first resistance string, and
   the second comparison voltage is outputted by directly connecting said first said resistance string and said second resistance string in serial.

6. The successive approximation-type analog-to-digital converter section according to claim 5, wherein said digital-to-analog converter outputs a third comparison voltage, by using a capacity array.

7. The successive approximation-type analog-to-digital converter according to claim 3, wherein said digital-to-analog converter section comprises:
   a first digital-to-analog converter having a resolution reduced from an original resolution for a predetermined number of bits and configured to output one of the plurality of comparison voltages; and
   a second digital-to-analog converter having a the original resolution and configured to output another of the plurality of comparison voltages,
   said first digital-to-analog converter determines a redundant comparison search voltage range at a timing after the parallel comparison by outputting the comparison voltage of the full resolution, and supplies the redundant digital data to said second digital-to-analog converter,
   said second digital-to-analog converter outputs the redundant comparison voltage based on the redundant digital data, and
   said comparator performs the redundant comparison in which the analog input voltage is compared with the redundant comparison voltage.

8. The successive approximation-type analog-to-digital converter according to claim 4, wherein said digital-to-analog converter section comprises $2^m$ (m is a positive integer) capacity arrays having the resolution reduced from the original resolution for the predetermined number of bits, said digital-to-analog converter outputs the first comparison voltage by using one of said capacity arrays, and outputs the second comparison voltage by connecting said $2^m$ capacitance arrays in parallel.

9. The successive approximation-type analog-to-digital converter according to claim 8, wherein said digital-to-analog converter section outputs a third comparison voltage as one of the plurality of comparison voltages, by using a resistance string.

10. An operation method of successive approximation-type analog-to-digital conversion comprising:
   a sampling and holding an analog input voltage;
   generating a plurality of comparison voltages based on a current digital data corresponding to a current search voltage range;
   performing a parallel comparison in which the held analog input voltage is compared with each of the plurality of comparison voltages;
   generating digital data for a next search voltage range within the current search voltage range based on a result of the parallel comparison using the current search voltage range, such that the parallel comparison is successively performed; and
   generating a switching signal from the parallel comparison to a redundant comparison such that the redundant comparison is performed.

11. The operation method according to claim 10, wherein said generating digital data comprises:
   generating as the current digital data, the digital data for a target search voltage range above the current search voltage range is set, when a result of the parallel comparison immediately before the redundant comparison indicates all "1" values, and
   generating as the current digital data, the digital data for a target search voltage range below the current search voltages range is set, when the result of the parallel comparison immediately before the redundant comparison indicates all "0" values.

12. The operation method according to claim 11, wherein said generating digital data comprises:
   generating the digital data for the target search voltage range as a redundant comparison digital data based on the result of the parallel comparison immediately before the redundant comparison,
   said generating a plurality of comparison voltages comprises:
   generating at least one redundant comparison voltage based on the redundant comparison digital data, and
   said performing a parallel comparison comprises:
   performing the redundant comparison in which the held analog input voltage and the redundant comparison voltage are compared.

13. The operation method according to claim 12, wherein said generating a plurality of comparison voltages comprises:
   generating a first comparison voltage as one of the plurality of comparison voltages, and a second comparison voltage as another of the plurality of comparison voltages based on the redundant comparison digital data, wherein the first comparison voltage corresponds to resolution reduced from an original resolution by a predetermined number of bits, and the second comparison voltage corresponds to the original resolution, said generating digital data comprises:
   generating the redundant comparison digital data at a timing after the last parallel comparison performed, and
   said generating a plurality of comparison voltages comprises:
   generating the redundant comparison voltage as the second comparison voltage based on the redundant comparison digital data, and
   said performing a parallel comparison comprises:
   performing the redundant comparison in which the analog input voltage and the redundant comparison voltage as the second comparison voltage are compared.

14. The operation method according to claim 13, wherein said generating a plurality of comparison voltages comprises:
   generating the first comparison voltage by using a first resistance string which has the resolution reduced from the original resolution for the predetermined number of bits; and
   generating the second comparison voltage by using a second resistance string which has the original resolution, by directly connecting said first said resistance string and said second resistance string in serial.

15. The operation method according to claim 14, wherein said generating a plurality of comparison voltages comprises:
   generating a third comparison voltage, by using a capacity array.

16. The operation method according to claim 12, wherein said generating a plurality of comparison voltages comprises:
   generating one of the plurality of comparison voltages from a first digital-to-analog converter having a resolution reduced from an original resolution for a predetermined number of bits;
   generating another of the plurality of comparison voltages from a second digital-to-analog converter having the original resolution;
   said generating one of the plurality of comparison voltages comprises:
   generating a redundant comparison search voltage range at a timing after the parallel comparison by outputting the comparison voltage of the full resolution, and supplies the redundant digital data to said second digital-to-analog converter,
   said second digital-to-analog converter outputs the redundant comparison voltage based on the redundant digital data, and
   said comparator performs the redundant comparison in which the analog input voltage is compared with the redundant comparison voltage.

17. The operation method according to claim 13, where in said generating a plurality of comparison voltages comprises:
   generating the first comparison voltage by using one of $2^m$ (m is a positive integer) capacity arrays having the resolution reduced from the original resolution for the predetermined number of bits; and
   generating the second comparison voltage by connecting said $2^m$ capacitance arrays in parallel.

18. The operation method according to claim 17, wherein said generating a plurality of comparison voltages comprises:
   generating a third comparison voltage as one of the plurality of comparison voltages, by using a resistance string.

* * * * *